(12) United States Patent
Suzuki et al.

(10) Patent No.: US 6,456,377 B1
(45) Date of Patent: Sep. 24, 2002

(54) METHOD FOR MEASURING OPTICAL FEATURE OF EXPOSURE APPARATUS AND EXPOSURE APPARATUS HAVING MEANS FOR MEASURING OPTICAL FEATURE

(75) Inventors: Kousuke Suzuki, Tokyo; Masayuki Murayama, Kanagawa-ken, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/456,010

(22) Filed: Dec. 7, 1999

Related U.S. Application Data

(63) Continuation of application No. 09/009,244, filed on Jan. 20, 1998, now abandoned.

(30) Foreign Application Priority Data

Jan. 20, 1997 (JP) .............................. 9-21026
Mar. 28, 1997 (JP) .............................. 9-76905

(51) Int. Cl.$^7$ ............................................ G01B 11/00
(52) U.S. Cl. ...................................................... 356/399
(58) Field of Search .............................. 356/375, 399, 356/400, 401; 355/53, 55, 77; 250/548, 561

(56) References Cited

U.S. PATENT DOCUMENTS

| 4,629,313 A | 12/1986 | Tanimoto ..................... 355/53 |
| RE32,795 E | 12/1988 | Matsuura et al. ........... 356/121 |
| 5,475,490 A | 12/1995 | Hirukawa et al. .......... 356/375 |
| 5,650,840 A | 7/1997 | Taniguchi .................... 355/55 |
| 5,654,553 A | 8/1997 | Kawakubo ................. 250/548 |
| 5,706,091 A | 1/1998 | Shiraishi ..................... 356/399 |

FOREIGN PATENT DOCUMENTS

| JP | 62-42421 | 2/1987 |
| JP | 4-155913 | 5/1992 |
| JP | 4-155914 | 5/1992 |
| JP | 4-155915 | 5/1992 |

*Primary Examiner*—Frank G. Font
*Assistant Examiner*—Tu T. Nguyen
(74) *Attorney, Agent, or Firm*—Armstrong, Westerman & Hattori, LLP

(57) ABSTRACT

A disclosed exposure apparatus comprises a photo-electric sensor having a light receiving portion supported by the substrate stage for a shifting movement within the shot area along the plane, a blind disposed between the light source and the project ion optical system and adapted to shield the illumination light reaching the shot area excluding an area surrounding the light receiving portion while the light receiving portion is being shifted along the plane.

27 Claims, 18 Drawing Sheets

METHOD FOR MEASURING OPTICAL FEATURE OF EXPOSURE APPARATUS AND EXPOSURE APPARATUS HAVING MEANS FOR MEASURING OPTICAL FEATURE

This application is a continuation of application Ser. No. 09/009,244 filed on Jun. 20, 1998 which is abandoned.

BACKGROUND OF THE INVENTION

1. Field of the Invention

The present invention relates to a projection exposure apparatus used to manufacture micro-device such as semi-conductor elements, liquid crystal display elements, camera elements (CCDs) and thin-film magnetic heads, by a lithographic process, and more particularly, it relates to a method for measuring optical features of an exposure apparatus such as light intensity distribution of illumination light used for transferring a pattern of a mask (for example, a reticle) onto a substrate (for example, a wafer or a glass plate) and an imaging feature of a projection optical system.

2. Description of the Related Art

In the past, for example, when semi-conductor elements or liquid crystal display elements are manufactured by a lithographic process, there have been used projection exposure apparatuses in which a pattern on a mask or a reticle (referred to generically as "reticle" hereinafter) is projected for exposure, through a projection exposure system, onto a sensitive substrate (such as a wafer) on which photo-resist is coated. In such projection exposure apparatuses, a high accurate imaging feature is required to form a fine or minute circuit pattern with high accuracy, and, high overlapping accuracy is required to put the pattern of the reticle to be currently exposure-treated on top of the patterns formed on the substrate during exposure for formation of previous layers, in order to successively form patterns of respective layers on the same area of the substrate in a laminated manner. Thus, an imaging feature of the projection exposure apparatus for focusing the reticle pattern onto the substrate must be adjusted with high accuracy, and, to this end, various methods for evaluating the imaging feature of the projection exposure apparatus prior to exposure treatment have been proposed.

As one of the methods for evaluating the imaging feature of the projection exposure apparatus, a method in is which a pattern of a test reticle on which a plurality of marks are formed is projected for exposure onto a substrate prior to actual production exposure and a developed test pattern image is observed has been utilized most popularly. However, in this method, since a preliminary exposure process and a preliminary developing process are required, longer time and much labor are required and a special device for measuring an image must be provided.

To eliminate such an inconvenience, there has been proposed a method in which a photo-electric sensor is provided on a stage on which a sensitive substrate is rested and a spatial image of a test pattern of a reticle formed through a projection optical system is directly observed on the basis of output from the sensor (for example, refer to Japanese Patent Laid-open No. 59-94032 (1984)) (U.S. Pat. No. 4,629,313). According to this method, the change in imaging feature caused by not only initial adjustment of the apparatus but also time-lapse change of the apparatus, or change in environmental conditions (such as atmospheric pressure and temperature), or absorption of illumination light of the imaging optical system, or change in conditions of the apparatus such as an illumination condition (solid angle and the like) to the reticle can easily be observed and the imaging feature can be corrected on the basis of the observed result. Recent projection exposure apparatuses include a mechanism for measuring the imaging feature of the projection optical system to carry out this method.

The following two methods for measuring the spatial image of the test pattern (referred to as "measurement pattern" hereinafter, because this test pattern is used for measuring the imaging feature) formed on the reticle by using the photo-electric sensor provided on the substrate stage are generally used in combination with the above-mentioned imaging feature measuring mechanism of the projection exposure apparatus.

In one of the above methods (first method), the spatial image of the single measurement pattern is measured while illuminating only a limited area on the reticle near the measurement pattern, and, after the measurement is finished, the setting of a blind (field stop) in the illumination system is altered and the illumination area on the reticle is switched to a limited area on the reticle near the next measurement pattern, and then, the spatial image of the next measurement pattern is measured. Similar operations are repeated.

In the other method (second method), the spatial images of the measurement patterns are successively measured while illuminating substantially the entire surface of the reticle.

Recently, as the semi-conductor elements become high density and circuit patterns become more minutely, higher resolving power and higher overlapping accuracy have been required. To this end, a plurality of measurement patterns are disposed within the reticle and the imaging feature of the projection optical system is evaluated more strictly by using the measured results of the spatial images of the measurement patterns in order to adjust the imaging feature of the projection optical system with high accuracy.

However, when the above-mentioned first method is used, although deterioration of the imaging feature due to absorption of the illumination light in the projection optical system is prevented by not illuminating the undesired areas, as the number of the measurement patterns (i.e., the number of measuring points or positions) is increased, the switching between the illumination areas imposes a bad influence upon the through-put.

On the other hand, when the above-mentioned second method is used, although there is no reduction of the through-put, since the entire surface of the reticle is illuminated by the illumination light during the measurement of all of the measurement patterns, the illumination light is absorbed by the reticle and the projection optical system, thereby worsening the imaging feature.

Further, in the exposure apparatus, light intensity distribution of the illumination light on the exposure surface is also measured.

Now, a method for measuring the light intensity distribution of the illumination light on the exposure surface in the conventional exposure apparatus will be described hereinbelow.

An illumination area is adjusted so that the illumination area of the exposure surface of the exposure apparatus becomes a maximum effective area. In general, the maximum effective area is a rectangular area or a square area having a diagonal line corresponding to a diameter of a circle slightly smaller than the maximum illumination area of a projection lens, which maximum effective area is referred to as "entire illumination area" and is used as a measurement range for seeking the light intensity distribution, for example.

A photo-electric conversion means for providing the light intensity distribution measurement is rested on the wafer stage so that a light receiving surface of the photo-electric conversion means becomes flush with an exposure surface of a wafer, and, by scan-moving the stage on which the photo-electric conversion means is rested relative to the measurement range, light intensity within the measurement range is measured by the photo-electric conversion means. The light intensity distribution within the measurement range is determined on the basis of an output value from the photo-electric conversion means and positional information of the light receiving surface from a position measuring means for measuring the position of the stage. An example of the measurement of the light intensity distribution is disclosed in Japanese Patent Publication No. 1-39207 (1989) (U.S. Pat. No. Re. 32,795), for example. Since the greater the number of different positions within the measurement range at which the light intensity is measured, the more accurate light intensity distribution can be obtained within the measurement range, the light intensity distribution is measured at various positions within the measurement range by successively shifting (or scan-moving) the photo-electric conversion means within the measurement range.

In the above-mentioned conventional technique, while the light intensity distribution of the illumination light is being measured, the illumination light from a light source passes through the projection lens. Thus, a part of the illumination light is absorbed as heat by an optical member of the projection lens, with the result that a temperature of the optical member is increased. Accordingly, when the exposure process is to be started after the measurement of the light intensity distribution, the exposure process cannot be started until the optical member is cooled to a stable condition, with the result that productivity or operability of the exposure apparatus is worsened.

Recently, the entire illumination area of the exposure apparatus has been increased. Consequently, a time period required for measuring the light intensity distribution within the measurement range has also been increased, with the result that various influences due to the heat on the projection lens tend to be increased during the measurement of the light intensity distribution.

In order to minimize the influence due to the heat on the projection lens, for example, the measuring time period may be shortened. This can be achieved by reducing the number of positions to be measured. In this case, however, the density of data of the light intensity distribution obtained within the measurement range becomes rough, with the result that the light intensity distribution cannot be correctly measured within the measurement range.

As a method for reducing light incident on the projection lens, it is considered that an amount of light incident on the projection lens is reduced by controlling a power supply portion of an exposure light source or by providing a beam attenuating filter in an exposure light path. However, such a method is not effective as the measuring method, since the light intensity distribution within the measurement range at the exposure surface of the photosensitive substrate may be varied with the change in illumination condition.

SUMMARY OF THE INVENTION

The present invention aims to eliminate the above-mentioned conventional drawbacks, and an object of the present invention is to provide a measuring method in which, when an optical feature of an exposure apparatus is measured, an error caused due to absorption of illumination light can be reduced as much as possible, and an exposure apparatus in which such measurement is permitted.

Another object of the present invention is to provide a focusing feature (imaging feature) correcting method in which change in focusing feature due to absorption of illumination light of a mask and a projection optical system can be suppressed as much as possible, without affecting a bad influence upon through-put by the switching of illumination areas.

The other object of the present invention is to achieve measurement of light intensity distribution with high accuracy while eliminating an influence of illumination light incident on a projection lens.

To achieve the above object, the present invention provides a method for measuring an optical feature, which can be applied to an exposure apparatus comprising a projection optical system, an illumination system including a light source and adapted to send exposure illumination light to the projection optical system, and a substrate stage for supporting a sensitive substrate so that the sensitive substrate is exposed by the illumination light passed through the projection optical system, and wherein a shot area of the illumination light is defined on a plane corresponding to a top surface of the sensitive substrate.

In such a method, there is provided a photo-electric sensor having a light receiving portion shiftable within the shot area along the plane, and the illumination light passed through the projection optical system is detected at a plurality of positions within the shot area; meanwhile, the illumination light reaching the shot area excluding an area surrounding the light receiving portion is shielded.

The present invention further provides an exposure apparatus comprising a projection optical system, an illumination system including a light source and adapted to send exposure illumination light to the projection optical system, and a substrate stage for supporting a sensitive substrate so that the sensitive substrate is exposed by the illumination light passed through the projection optical system, and wherein a shot area of the illumination light are defined on a plane corresponding to a top surface of the sensitive substrate.

This apparatus includes a photo-electric sensor having a light receiving portion supported by a substrate stage for a shifting movement within the shot area along the plane, a blind disposed between the light source and the projection optical system and adapted to shield the illumination light reaching the shot area excluding an area surrounding the light receiving portion while the light receiving portion is being shifted along the plane, and a control system for obtaining an optical feature of the exposure apparatus on the basis of a signal from the photo-electric sensor.

The present invention further provides a focusing feature correcting method for correcting a focusing feature of a projection optical system for projecting an image of a pattern formed on a mask onto a substrate. This method includes a first step for preparing a mask having a plurality of mark patterns; a second step for illuminating an area including one mark pattern formed on the mask by illumination light to photo-electrically detect a projected image of the mark pattern passed through the projection optical system and for setting an illumination area so that a limited area including a position of the mark pattern being detected and a position of a next mark pattern is illuminated during detection of the projected image; a third step for calculating a focusing feature of the projection optical system on the basis of data of the projected image detected in the second step, after the second step was performed by at least one time; and a fourth step for correcting the focusing feature of the projection optical system on the basis of a calculated result obtained in the third step.

According to this method, in the second step, when the area including one mark pattern formed on the mask by the illumination light to photo-electrically detect the projected image of the mark pattern passed through the projection optical system, the illumination area is set so that the limited area including the position of the mark pattern being detected and the position of the next mark pattern is illuminated. After the second step was performed by one time or plural times, the third step calculating the focusing feature of the projection optical system on the basis of data of the respective projected images detected in the first step is performed, and, in the fourth step, the focusing feature of the projection optical system is corrected on the basis of the calculated result.

In this way, since the illumination area is set so that the limited area including the position of the mark pattern being detected and the position of the next mark pattern is illuminated during the photo-electric detection of the projected image of the mark pattern passed through the projection optical system, when the projected image of the next mark pattern is detected, because the illumination area is set to include the next mark pattern, the detection of the projected image of the next mark pattern can be started immediately, with the result that the switching of the illumination areas does not affect a bad influence upon the through-put. Further, since the illumination area is limited to the area including the single mark pattern or the limited area including the position of the mark pattern being detected and the position of the next mark pattern at the maximum, the change in the focusing feature due to the absorption of the illumination light of the mask and the projection optical system can be suppressed as much as possible.

The present invention further provides a projection exposure apparatus for illuminating a mask on which a pattern is formed by illumination light and for projecting and exposing an image of the pattern onto a sensitive substrate through a projection optical system. This apparatus comprises a mask stage for supporting a mask having a plurality of mark patterns; an illumination means having an illumination area defining means for defining an illumination area on the mask and adapted to cause illumination light to illuminate the illumination area on the mask defined by the illumination area defining means; a substrate stage on which a sensitive substrate is rested; a relative shift means for shifting the mask and the substrate stage relative to each other in a predetermined direction; a photo-electric detection means for photo-electrically detecting projected images of the mark patterns (formed on the mask) obtained by the projection optical system during the relative shifting movement; a control means for controlling the illumination area defining means so that a limited area including a position of the mark pattern being detected and a position of a next mark pattern is illuminated while one mark pattern on the mask is being detected by the photo-electric detection means, thereby changing the illumination area and including a calculation means for a focusing feature of the projection optical system on the basis of data of the projected images detected by the photo-electric detection means; and a focusing feature correcting means for correcting the focusing feature of the projection optical system on the basis of a calculated result from the calculation means.

According to this apparatus, in a condition that the predetermined illumination area on the mask (for example, an area near one mark pattern on the mask) defined by the illumination area defining means is illuminated by the illumination light, when the mask and the substrate stage are shifted relative to each other in the predetermined direction by the relative shift means, the projected image (spatial image) of the mark pattern on the mask projected on the substrate stage through the projection optical system is detected photo-electrically during the relative shifting movement. While the projected image of one mark pattern is being detected by the photo-electric detection means in this way, the control means controls the illumination area defining means so that the limited area including the position of the mark pattern being detected and the position of the next mark pattern is illuminated, thereby changing the illumination area. The detecting operation for detecting the projected image of the mark pattern and the simultaneous changing operation for changing the illumination area are successively performed regarding different mark patterns on the mask. When the detection of the projected images of the mark patterns is finished, the focusing feature of the projection optical system is calculated by the calculation means on the basis of the data of the projected images detected by the photo-electric detection means, and the focusing feature of the projection optical system is corrected by the focusing feature correction means on the basis of the calculated result from the calculation-means.

In this way, while the projected image of the mark pattern passed through the projection optical system is being detected photo-electrically, since the control means controls the illumination area defining means so that the limited area including the position of the mark pattern being detected and the position of the next mark pattern is illuminated, thereby changing the illumination area, when the projected image of the next mark pattern is detected, because the illumination area is set to include the next mark pattern to be detected, the detection of the projected image of the next mark pattern can be started immediately, with the result that the switching of the illumination areas does not affect a bad influence upon the through-put. Further, since the illumination area is limited to the area including the single mark pattern or the limited area including the position of the mark pattern being detected and the position of the next mark pattern at the maximum, the change in the focusing feature due to the absorption of the illumination light of the mask and the projection optical system can be suppressed as much as possible.

In this case, the illumination area defining means may be sufficient to set the illumination area having a predetermined shape (for example, rectangular shape) at any position on the mask. However, the illumination area defining means may include a rotating function for rotating the illumination area in a plane perpendicular to an optical axis of the illumination light. In this case, the degree of freedom of arrangement of the mark patterns on the mask can be improved.

Further, in this case, although the photo-electric detection means may directly detect the spatial image of the mark pattern photo-electrically, when the data of the projected images detected by the photo-electric detection means is integrated data of the spatial images of the mark patterns, the calculation means may differentiate the integrated data in a relative scanning direction. Also in this case, since the data of the spatial images of the mark patterns can be obtained, the calculation of the focusing feature on the basis of the data of the spatial images and the correction of the focusing feature of the projection optical system on the basis of the calculated result can be performed.

Normally, when the data of the projected images detected by the photo-electric detection means is the integrated data of the spatial images of the mark patterns, an opening portion corresponding to a dimension of the mark pattern on the mask is provided on the substrate stage and the mark pattern is photo-electrically detected through the opening portion. Thus, in this case, since a signal is not averaged unlike to a case where a signal is passed through a slit-shaped opening portion, a signal corresponding to the actual image can be obtained.

The focusing feature of the projection optical system may include various factors. And, the calculation means may calculate at least one of magnification, distortion, coma, spherical surface, focus, astigmatism and field curvature, and the focusing feature correction means may correct the focusing feature calculated by the calculation means. Such focusing feature correction means may be constituted by a relatively simple means such as a means for driving a part of lens elements forming the projection optical system in the optical axis direction or in the oblique direction or a means for adjusting pressure in closed space(s) between the lens elements.

The present invention further provides an exposure apparatus for projecting an image of a pattern on a mask onto a sensitive substrate through a projection optical system, which comprises a photo-electric conversion means for measuring light intensity distribution of illumination light for illuminating the sensitive substrate while shifting within a predetermined plane near an image plane of the projection optical system, a light shield means disposed substantially in conjugation with an exposure plane of the sensitive substrate and adapted to define an illumination area on the sensitive substrate, and a control means for controlling the light shield means in association with the shifting movement of the photo-electric conversion means so that the illumination area defined by the light shield means becomes smaller than a measurement range of the light intensity distribution when the light intensity distribution is measured.

The control means may control the light shield means in association with a shifting movement of a stage portion on which the photo-electric conversion means is provided.

In this case, a light amount of the illumination light passed through the projection optical system is regulated by the light shield means reducing a light amount of the illumination light incident on the projection optical system, and, by shifting the light shield means and the photo-electric conversion means in synchronous with each other, a light amount of the illumination light on the light receiving surface of the photo-electric conversion means at each measuring position within the measurement range permits the measurement of the light intensity distribution within the measurement range, in the same condition as that the light amount of the illumination passed through the projection optical system is not regulated by the light shield means.

The present invention further provides a measuring method for measuring light intensity distribution of illumination light for illuminating a sensitive substrate to project a pattern on a mask onto the sensitive substrate through a projection optical system, wherein a photo-electric conversion means is shifted within a measurement range at which the light intensity distribution is sought during measurement of the light intensity distribution so that an illumination area of the illumination light is made smaller than the measurement range and is changed in association with a position of the photo-electric conversion means during the measurement of the light intensity distribution.

In this case, a light amount of the illumination light passed through the projection optical system is regulated by a light shield means reducing a light amount of the illumination light incident on the projection optical system, and, by shifting the light shield means and the photo-electric conversion means in synchronous with each other, a light amount of the illumination light on the light receiving surface of the photo-electric conversion means at each measuring position within the measurement range permits the measurement of the light intensity distribution within the measurement range, in the same condition as that the light amount of the illumination passed through the projection optical system is not regulated by the light shield means.

By setting the illumination area by means of the light shield means, at least an area (and therearound) where the photo-electric conversion means is positioned is selected as the illumination area, and, by shifting the illumination area by driving the light shield means and at the same time by controlling to shift the light receiving surface of the photo-electric conversion means into the illumination area, the light amount of the illumination light on the light receiving surface of the photo-electric conversion means at each measuring position within the measurement range permits the measurement of the light intensity distribution within the measurement range, in the same condition as that the light amount of the illumination passed through the projection optical system is not regulated by the light shield means.

BRIEF DESCRIPTION OF THE SEVERAL VIEWS OF THE DRAWING

FIGS. 10A to 10G are views for explaining a method for correcting a focusing (imaging) feature, visually showing transition of the illumination area on the detection sequence for detecting projected images of the plurality of measurement marks on the reticle;

DETAILED DESCRIPTION OF THE INVENTION

Now, a first embodiment of the present invention will be explained with reference to FIGS. 1 to 10.

Figure 1:
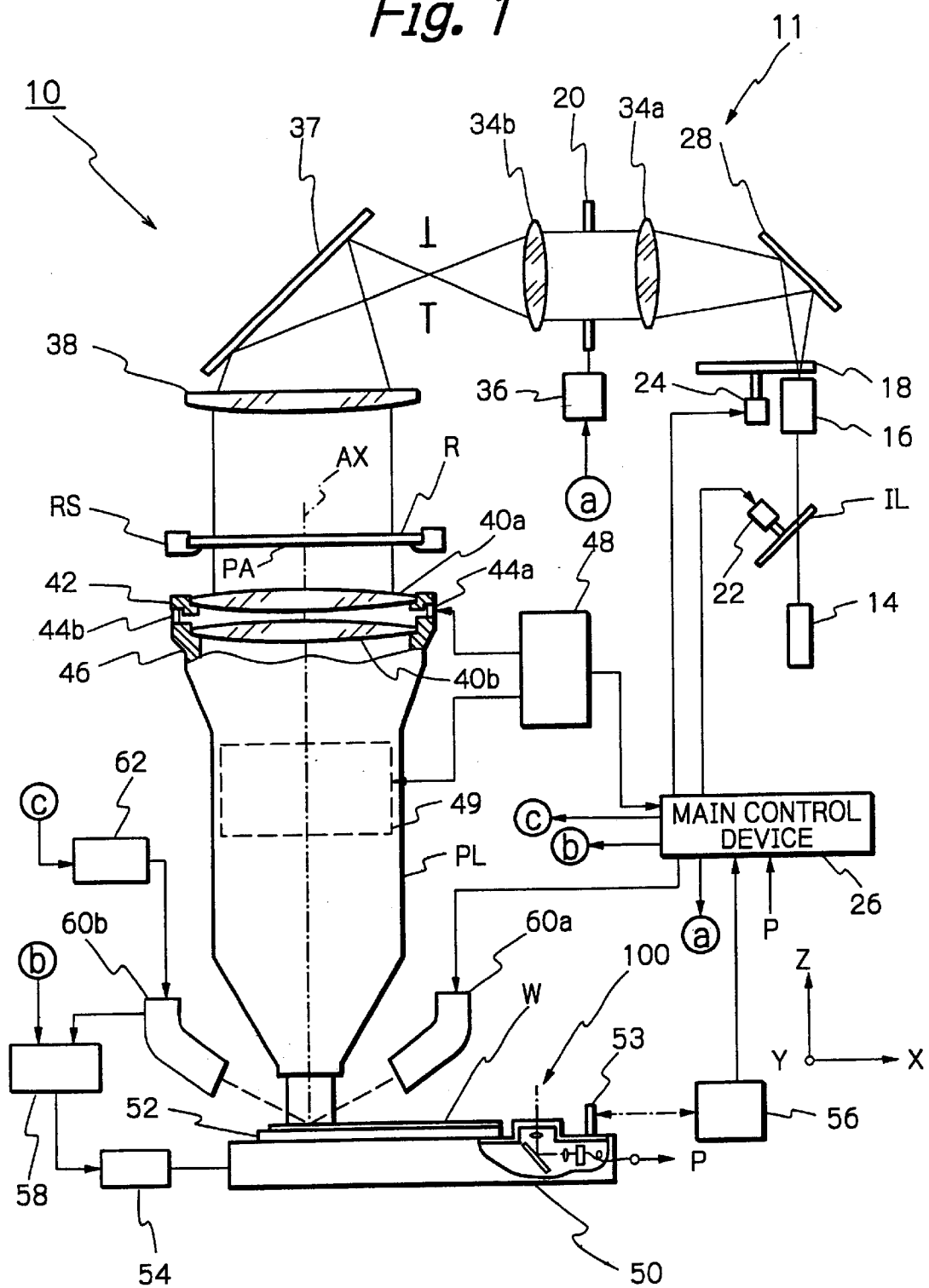
FIG. 1 is a schematic view of a projection exposure apparatus according to a first embodiment of the present invention.

FIG. 1 schematically shows a projection exposure apparatus 10 according to a first embodiment of the present invention. The projection exposure apparatus 10 is an exposure apparatus of reduction-projection type (so-called wafer stepper) in which a pattern image formed on a reticle R (as a mask) is projected onto shot areas of a wafer W as a substrate (sensitive substrate) through a projection optical system PL in a step-and-repeat manner.

The projection exposure apparatus 10 includes an illumination system (as illumination means) 11 having a light source 12, a reticle stage RS for holding a reticle R, a projection optical system PL for projecting a pattern image formed on the reticle R onto a wafer W, a wafer stage (as substrate stage) 50, an imaging feature correction device for correcting an imaging feature of the projection optical system PL such as magnification or distortion, and a focus correction device (also one of imaging feature correction device), and a control system.

The illumination system 11 includes the light source 12 comprised of a high voltage mercury lamp or an excimer laser, a shutter 14 for opening and closing a light path of illumination light, an illuminance-uniform optical system 16 having an optical integrator (fly-eye lens), an illumination system aperture stop plate (revolver) 18, and a variable blind (field stop) (as illumination area defining device) 20 for defining an illumination field of the illumination light, i.e., an illumination area on the reticle R. The shutter 14 is driven by a driving portion 22 and serves to permit or inhibit passage of the illumination light IL (i-ray, g-ray, excimer laser beam (KrF, ArF) or the like) emitted from the light source 12. he illuminance-uniform optical system 16 is disposed in a light path behind the shutter 14, so that the light flux of the illumination light IL is made uniform and speckle is reduced. The illumination system aperture stop plate 18 comprised of a circular plate member is disposed at an exit portion of the illuminance-uniform optical system 16. The illumination system aperture stop plate 18 is provided with an aperture stop formed by a standard circular opening, an aperture stop formed by a small circular opening and adapted to reduce a σ value (coherence factor), a ring-shaped aperture stop for annular zone illumination and a deformation aperture stop formed by a plurality of eccentric openings for a deformation light source, and these aperture stops (not shown) are arranged at an equidistant angular interval. The illumination system aperture stop plate 18 is rotatingly driven by a driving device 24 such as a motor controlled by a main control device 26 so that one of the aperture stops can be selectively positioned on the light path of the illumination light.

A half mirror 28 is disposed in the light path behind the Illumination system aperture stop plate 18, and a set of relay lenses 34a, 34b with the interposition of the variable blind (illumination area defining device) 20 are disposed in the light path of the illumination light IL behind the half mirror 28. The plane of the variable blind 20 is in conjugation with the reticle R, so that the illumination area (illumination field) on the reticle R can freely be set by changing the position and shape of the aperture by opening and closing movable blades of the variable blind 20 by means of a driving mechanism 36. The details of the variable blind 20 will be described later.

A mirror 37 for reflecting the illumination light IL passed through the set of relay lenses 34a, 34b toward the reticle R is disposed in the light path of the illumination light IL behind the set of relay lenses 34a, 34b, and a condenser lens 38 is disposed in the light path of the illumination light IL behind the mirror 37.

Figure 4:
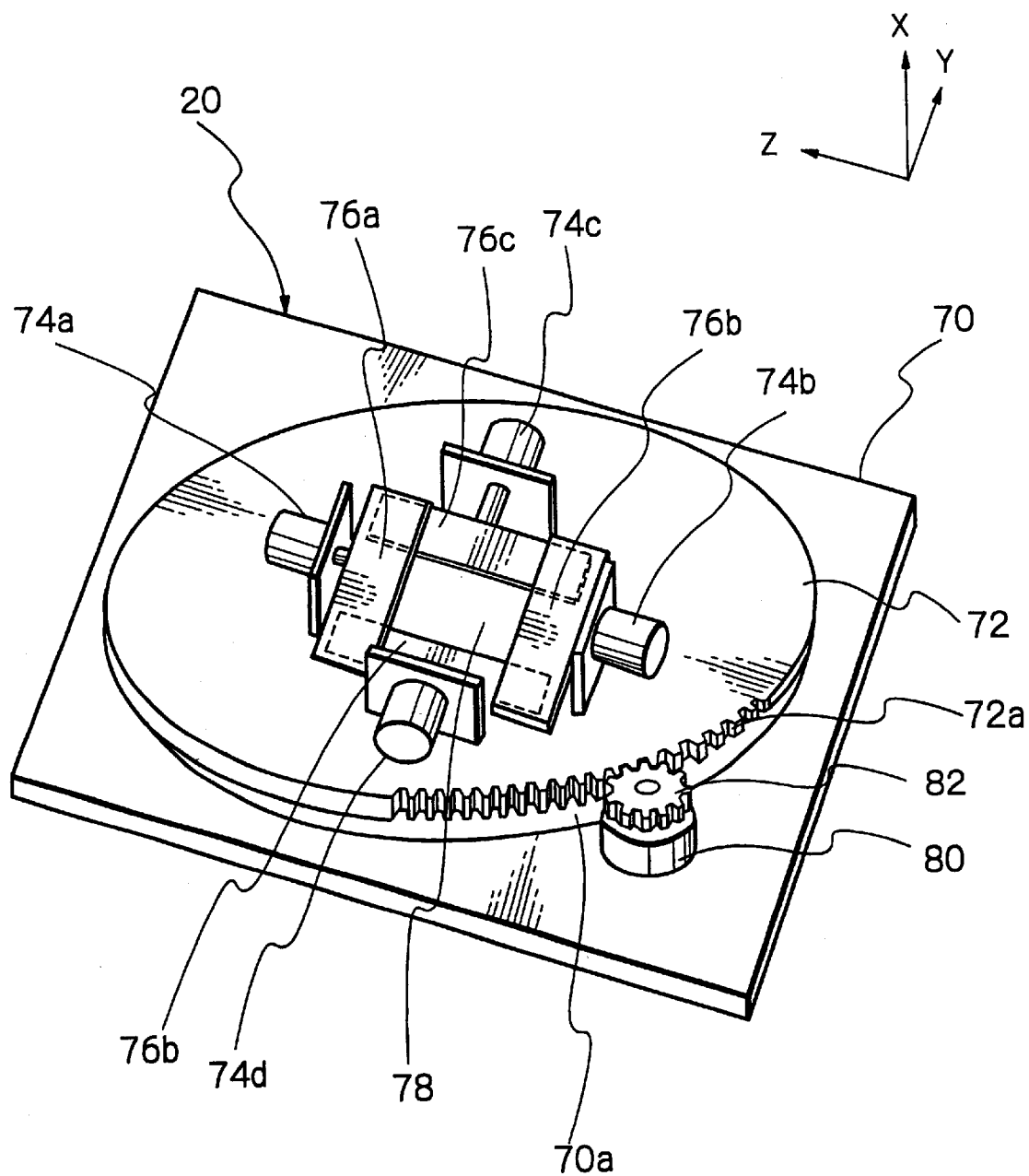
FIG. 4 is a schematic perspective view a variable blind of FIG. 1.

As shown in FIG. 4, the variable blind 20 comprises a substantially square plate-shaped base plate 70, a circular member 72 rotatably attached to an upper (FIG. 4) surface of the base plate 70, and four blades 76a, 76b, 76c, 76d independently driven in a Y-Z plane by means of four motors 74a, 74b, 74c, 74d secured to an upper (FIG. 4) surface of the circular member 72. In addition, the blades 76a, 76b are driven in±Z direction by the motors 74a, 74b, respectively, and the blades 76c, 76d are driven in±Y direction by the motors 74c, 74d, respectively, so that the blind opening 78 can be set to any rectangular shape (including dimension).

Now, explaining a mechanism for rotating the circular member 72, an annular projection 70a is formed on the upper (FIG. 4) surface of the base plate 70 (one surface facing in the X axis), and a boss portion (not shown) provided on a lower (FIG. 4) surface of the circular member 72 is engaged with the annular projection 70a via a ball bearing (not shown). Further, a toothed portion 72a is formed on a quarter of an outer periphery of the circular member 72, and a drive gear 82 meshed with the toothed portion 72a is secured to a rotary shaft of a motor 80 secured to the base plate 70. Thus, the drive gear 82 is rotated by rotation of the motor 80, and a rotational force of the gear is transmitted to the circular member 72 through the toothed portion 72a, with the result that the circular member 72 together with the boss portion is rotated around the boss portion within an angular range of 90 degrees with respect to the annular projection 70a. An opening is formed within the boss portion of the circular member 72, and a dimension of the opening is greater than the blind opening 78 shown in FIG. 4.

The variable blind 20 having the above-mentioned construction serves to define the illumination area on the pattern surface of the reticle R to any rectangular shape and has a function for rotating the rectangular illumination area. In this case, the drive mechanism 36 of FIG. 1 is constituted by the motors 74a, 74b, 74c, 74d and the drive gear 82.

Returning to FIG. 1, the reticle R is rested on the reticle stage RS and is held by a reticle holder (not shown). The reticle stage RS can be shifted two-dimensionally in a horizontal plane so that, after the reticle R is rested on the reticle stage RS, the reticle stage can be positioned to align a center of a pattern area RA of the reticle R with an optical axis AX. The initial setting of the reticle R is effected by detecting alignment marks (not shown) around the reticle photo-electrically by means of a reticle alignment system (not shown) and by shifting the reticle stage RS minutely in response to mark detection signals. The reticle R can be exchanged to new one appropriately by a reticle exchanger (not shown).

The projection optical system PL is constituted by a plurality of lens elements 40a, 40b, . . . having common optical axes to provide bilateral telecentric optical arrangement. Among these lens elements, the uppermost lens element 40a nearest to the reticle stage RS is held by a ring-shaped support member 42 which is supported at three points by expansion driving elements such as piezo-elements 44a, 44b, 44c (44c is not shown not shown) and is connected to a lens barrel 46. The three points around the lens element 40a can be shifted independently along the optical axis AX of the projection optical system PL by means of the driving elements 44a, 44b, 44c. That is to say, the lens element 40a can be translated along the optical axis AX in response to deformation amounts of the driving elements 44a, 44b, 44c and can be inclined with respect to a plane perpendicular to the optical axis AX. Voltages applied to the driving elements 44a, 44b, 44c are controlled by an imaging feature correction controller 48 in response to command from the main control device 26 to control the deformation amounts of the driving elements 44a, 44b, 44c. In FIG. 1, the optical axis AX of the projection optical system PL is an optical axis of the lens element 40a and other lens elements (not shown) secured to the lens barrel 46.

In the illustrated embodiment, a closed or sealed chamber 49 is formed between two adjacent particular lens elements disposed in the vicinity of the center of the projection optical system PL in the optical axis direction, and internal pressure of the closed chamber 49 is adjusted by a pressure adjusting mechanism (not shown) such as a bellows pump. The pressure adjusting mechanism is also controlled by the imaging feature correction controller 48 in response to command from the main control device 26 to adjust the internal pressure of the closed chamber 49.

Since it is apparent that the magnification and distortion of the projection optical system PL can be changed by shifting the lens element 40a along the optical axis AX and it is also apparent that the magnification can be changed by varying the internal pressure of the closed chamber 49 of the projection optical system PL, in the illustrated embodiment, the imaging feature correction means for mainly controlling the magnification and distortion is constituted by the imaging feature correction controller 48 for controlling the driving elements 44a, 44b, 44c, closed chamber 49, displacement amounts of the driving elements and internal pressure of the closed chamber.

It is also possible that an lens element other than the element 40a (lens element 40b for example) of the projection optical system PL is made movable along the optical axis AX with maintaining the parallel relationship and also made displaceable to slant with respect to a plane normal to the optical axis AX so that, by driving respective lens elements 40a and 40b to adjust the magnification and the distortion. It is also possible that at least one of lens elements other than lens elements 40a and 40b is made movable as the lens element 40a is, so as to adjust aberrations of the projection optical system PL other than the distortion. It is also possible that three lens elements, for example, of the projection optical system PL are made movable to adjust astigmatism, coma and spherical aberration. In this case, curvature of field of the projection optical system PL changes upon adjustment of the astigmatism, it is possible to adapt the arrangement so that the curvature of field (Petzval surface) is adjusted by changing the pressure in the closed chamber 49.

Also in the illustrated embodiment, a relation between a displacement amount (up-down shift amount) of the lens element 40a and a change amount of the magnification is previously determined by tests and the determined relation is previously stored in a memory of the main control device 26 so that the displacement amount of the lens element 40a can be calculated from the magnification to be corrected by the main control device 26 and the magnification can be corrected by driving the driving elements 44a, 44b, 44c in response to command from the imaging feature correction controller 48 on the basis of a calculated result. The relation between the displacement amount of the lens element 40a and the change amount of the magnification may be determined by using optical calculation values, and, in this case, the tests for determining the relation between the displacement amount of the lens element 40a and the change amount of the magnification can be omitted.

As mentioned above, although the lens element 40a disposed nearest to the reticle R is shiftable, the lens element 40a is selected as one of lens elements which imposes the greatest influence upon the magnification and distortion among them and can easily be controlled. Thus, so long as the same condition is satisfied, in place of the lens element 40a, any lens element may be made shiftable to adjust the distance between the lens elements.

Similarly, in the illustrated embodiment, a relation between a change amount of the internal pressure of the closed chamber 49 and a change amount of the magnification is previously determined by tests and the determined relation is previously stored in a memory of the main control device 26 so that the change amount of the internal pressure of the closed chamber 49 can be calculated from the magnification to be corrected by the main control device 26 and the magnification can be corrected by increasing or decreasing the internal pressure of the closed chamber 49 in response to command from the imaging feature correction controller 48 on the basis of a calculated result. Fundamentally, the magnification is changed in proportion to the internal pressure of the closed chamber 49. Also in this case, change in index of refraction due to the change in internal pressure, and deformation and displacement of the lens elements defining the closed chamber due to the change in internal pressure can be calculated by simulation.

Further, for example, some of lens elements forming the projection optical system PL may be constituted by aspheric lenses which can be rotated. In this case, so-called rhombic distortion can be corrected. Alternatively, the imaging feature correction device may be constituted by parallel flat plates which are provided within the projection optical system PL and which can be tilted or rotated.

The wafer stage 50 is disposed below the projection optical system PL. The wafer stage 50 is actually constituted by an XY stage which can be shifted two-dimensionally in a horizontal plane (XY plane) and a Z stage which is mounted on the XY stage and can be shifted minutely in the optical axis direction (Z direction), and, in FIG. 1, such a wafer stage 50 is illustrated. In the following explanation, it is regarded that the wafer stage 50 is driven two-dimensionally in the XY direction by a drive system 54 and is also driven minutely in the optical axis direction AX within a small range (for example, about 100 µm).

The wafer W is secured to the wafer stage 50 via a wafer holder 52 in a vacuum suction manner. A two-dimensional position of the wafer stage 50 is always detected with resolving power of about 0.01 µm, for example, by a laser interferometer 56 through a shift mirror 53 secured to the wafer stage 50, and output from the laser interferometer 56 is sent to the main control device 26. Command from the main control device 26 is sent to a stage controller 58, so that the drive system 54 is controlled by the stage controller 58. By using such a closed loop control system, for example, the wafer stage 50 is shifted to a next shot position in a stepping manner after the pattern of the reticle R is transferred by exposure onto one of shot areas on the wafer W.

The focus correction device comprises a focus detection system of oblique incident light type including an illumination optical system 60a for emitting image focusing light flux or parallel light flux for forming a pinhole image or a slit image toward the focusing plane of the projection optical system PL from an oblique direction with respect to the optical axis AX, and a light receiving optical system 60b for receiving the light flux (of the focusing light flux or parallel light flux) reflected by the wafer W; and a focus correction controller 62 for correcting variation of the focus of the projection optical system PL by applying "offset" to the focus detection system by controlling inclination of parallel flat plates (not shown) in the light receiving optical system 60b with respect to the optical axis of the reflected light flux in response to command from the main control device 26. An out-of-focus signal (de-focus signal) from the light receiving optical system 60b is sent to the stage controller 58, and, in the stage controller 58, auto-focus (automatic focusing) is effected by controlling the Z position of the wafer stage 50 via the drive system 54 in response to the out-of-focus signal (for example, an S-curve signal) to eliminate the out-of-focus situation.

The reason why the offset is applied to the focus detection system (60a, 60b) by providing the parallel flat plates in the light receiving optical system 60b is that, for example, since the focus is changed when the lens element 40a is shifted in the up-and-down direction for correcting the magnification and also when the imaging feature is changed by absorption of the exposure light in the projection optical system PL, the focus position of the focus detection system must be changed to coincide with the position of the focusing plane of the projection optical system PL by applying the offset to the focus detection system. Thus, in the illustrated embodiment, a relation between the displacement amount (up-down shift amount) of the lens element 40a and a change amount of the focus is previously determined by tests and the determined relation is previously stored in the memory of the main control device 26. The relation between the displacement amount of the lens element 40a and the change amount of the focus may be determined by using calculation values.

In FIG. 1, the control system is constituted by the main control device 26. The main control device 26 is constituted by a so-called microcomputer (or a mini computer) including a CPU (central processing unit), a ROM (read only memory) and a RAM (random access memory) and serves to control alignment between the reticle R and the wafer W, stepping of the wafer W and exposure timing of the shutter 14 to perform the exposure operation properly. Further, the main control device 26 serves to calculate a change amount of the imaging feature of the projection optical system PL on the basis of a detection result of projected images (spatial images) of measurement marks (mark patterns) which will be described later and to control the entire apparatus including the imaging feature correction controller 48, in order to correct the imaging condition.

In the exposure apparatus 10 having the above-mentioned construction, during the exposure, after the illumination light IL emitted from the light source 12 passes through the shutter 14, the illumination light is directed toward the illuminance-uniform optical system 16. When the illumination light is passed through the illuminance-uniform optical system 16, the light flux is made uniform, and, after the illumination field of the illumination light is defined or regulated by the aperture stop of the illumination system aperture stop plate 18, the light is reflected by the mirror 28 to be incident on the relay lenses 34a, 34b and the variable blind 20. After the illumination area of the reticle R is defined (or regulated) by the variable blind, the illumination light IL is reflected by the mirror 37 vertically downwardly to reach the condenser lens 38, and then illuminates the pattern area PA within the illumination area of the reticle R with uniform illuminance. After the illumination light IL passes through the pattern area PA of the reticle, the illumination light is incident on the projection optical system PL. The light flux passed through the projection optical system PL is collected on one of the shot areas on the wafer W, thereby focusing the circuit pattern image of the reticle R on the shot area. The focusing condition has been corrected in the manner described later.

Next, a photo-electric sensor unit (photo-electric detection device) 100 for photo-electrically detecting the projected images of the measurement marks (pattern marks) formed on the reticle R passed through the projection optical system PL to measure the imaging feature of the projection optical system PL will be explained with reference to FIG. 2.

Figure 2:
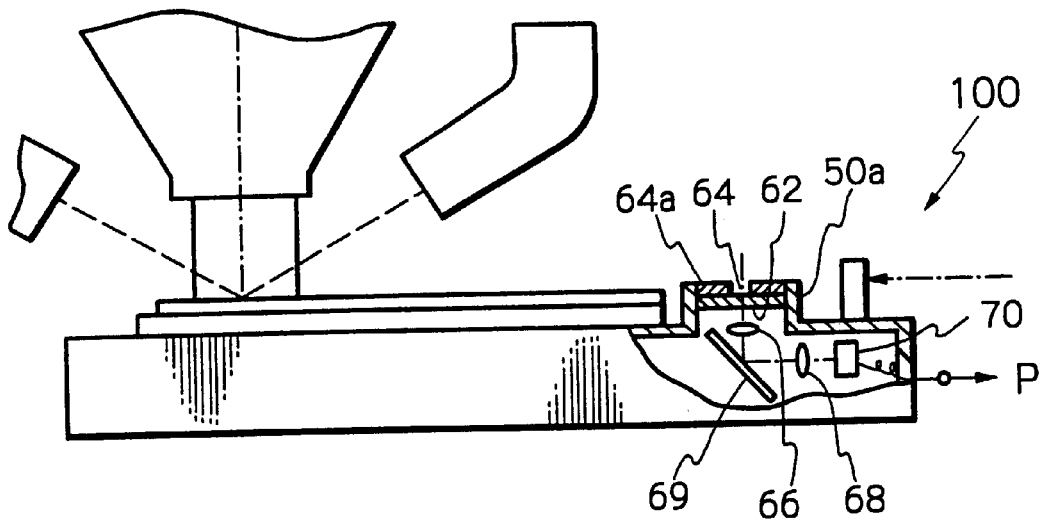
FIG. 2 is an enlarged view showing a wafer stage of FIG. 1 and an area therearound.
Figure 3:
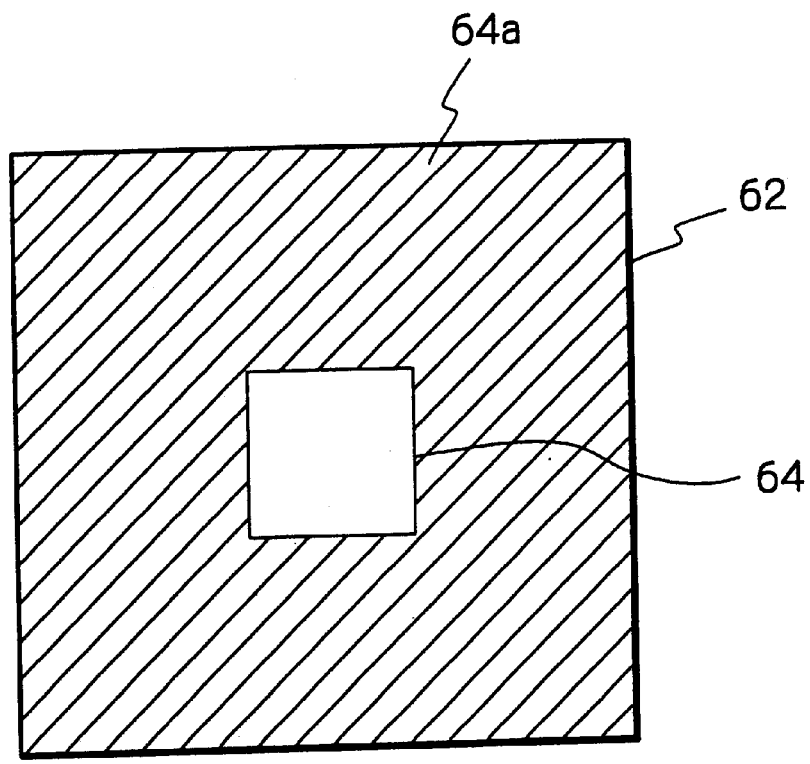
FIG. 3 is a plan view of a light receiving glass plate of FIG. 2.

FIG. 2 is an enlarged view showing the wafer stage 50 and the vicinity, as well as the photo-electric sensor unit 100. In FIG. 2, a projection 50a having an open top is provided on the upper surface of the wafer stage 50 in its one end portion, and a light receiving glass plate 62 is received in the projection to close the open top thereof. As shown in FIG. 3 which is an enlarged plan view, an opening pattern 64 is formed in the light receiving glass plate 62 at a central portion thereof. In FIG. 3, a hatched portion shows a light shield zone 64a formed by a chrome layer.

Returning to FIG. 2, below the opening pattern 64 and within the wafer stage 50, there are provided a light receiving optical system including a relay optical system comprised of lenses 66, 68 and a deflection mirror 69 for deflecting the light path of illumination light flux (image light flux) relayed by the relay optical system (66, 68) in a predetermined light path length, and a photo-electric sensor 70 consisting of a photo-electric conversion element such as a silicone photo-diode or a photo-multiplier.

In the illustrated embodiment, the photo-electric sensor unit 100 is constituted by the projection 50a formed on the upper surface of the wafer stage 50 at its one end, the light receiving glass plate 62, the opening pattern 64 defined by the light shield zone 64a on the light receiving glass plate 62, the relay optical system (66, 68), the deflection mirror 69, and the photo-electric sensor 70.

According to this photo-electric sensor unit 100, when the projected images (passed through the projection optical system PL) of the measurement patterns (described later) formed on the reticle R are measured, the illumination light IL passed through the projection optical system PL is incident on the light receiving glass plate 62, and the illumination light passed through the opening pattern 64 on the light receiving glass plate 62 is passed through the light receiving optical system to reach the photo-electric sensor 70, where the photo-electric conversion is effected and a light amount signal P corresponding to the received light amount is outputted to the main control device 26.

Next, a method for detecting the projected images of the measurement marks on the reticle R by using the photo-electric sensor unit 100 will be explained. Incidentally, the method is explained in detail in U.S. Pat. No. 5,650,840.

Figure 5:
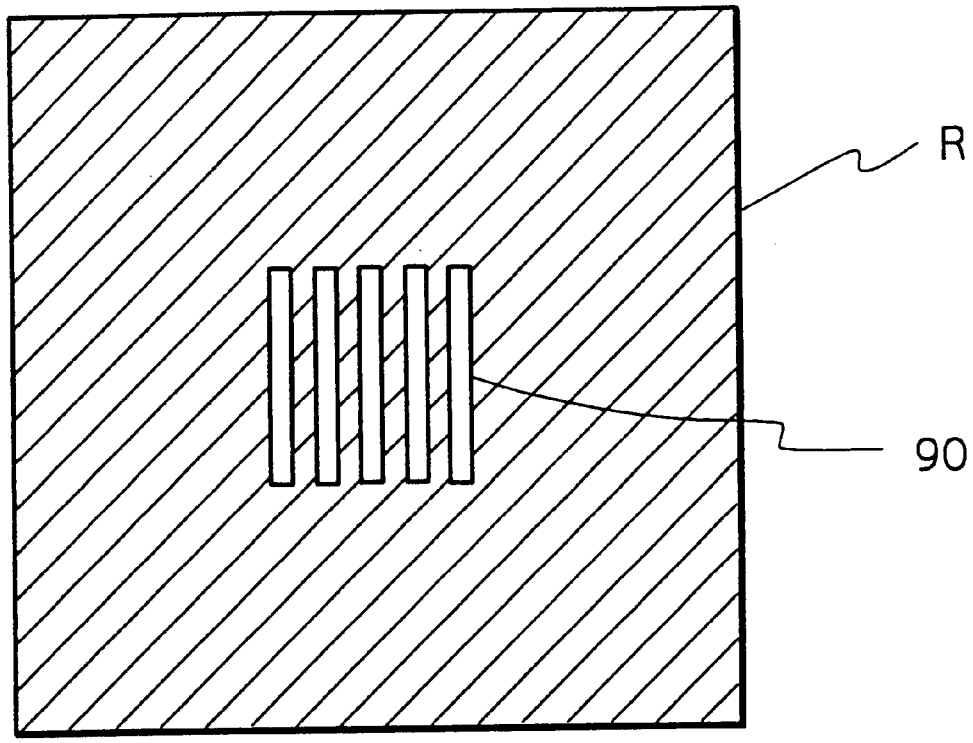
FIG. 5 is a plan view showing an example of a measurement mark formed on a reticle.

Here, it is assumed that a measurement mark (mark pattern) 90 of line-and-space (L/S) type comprised of five bar marks as shown in FIG. 5 is formed on the reticle R. In FIG. 5, the hatched area indicates a light shield portion.

The detection of the projected image is started after the wafer stage 50 is shifted so that the light shield portion 64a (at the wafer holder 52 side) of the opening pattern 64 on the light receiving glass plate 62 is positioned at a position where it is aligned with the optical axis AX of the projection optical system PL.

Figure 6:
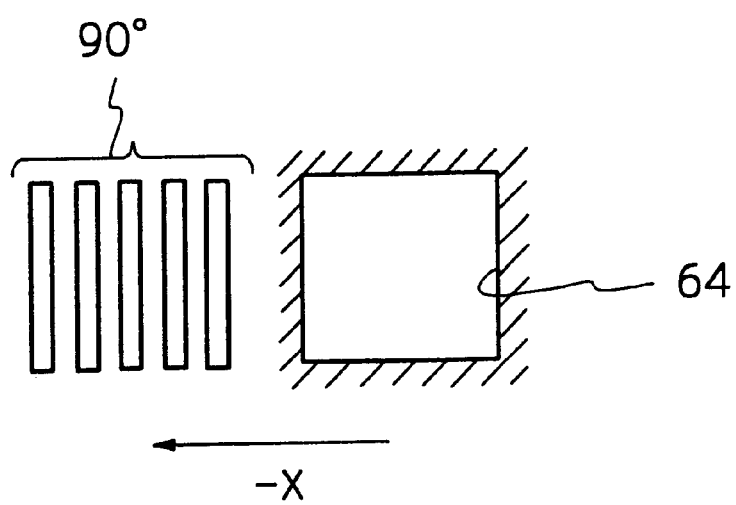
FIG. 6 is a view for explaining a photo-electric detection method for detecting a projected image of the measurement mark of FIG. 5.

In this start position, when the measurement mark 90 is illuminated by the illumination light IL from the illumination system 11, a projected image 90' of the measurement mark 90 is focused on the light shield portion 64a (at the wafer holder 52 side) of the opening pattern 64 of the light receiving glass plate 62 on the wafer stage 50 by the illumination light IL passed through the measurement mark 90 (five bar marks). This condition is shown in FIG. 6.

By the stage controller 58, the wafer stage 50 is shifted in–X direction at a predetermined speed by means of the drive system 54 in response to the command from the main control device 26. As a result, the projected image 90' of the measurement mark 90 is gradually overlapped with the opening pattern 64 from the right. As the overlapped amount between the projected image 90' of the measurement mark 90 and the opening pattern 64 is increased, the light amount incident on the photo-electric sensor 70 is increased, and, the light amount becomes maximum when the projected image 90' of the measurement mark 90 is completely overlapped with the opening pattern 64. Thereafter, when the wafer stage 50 is further shifted in–X direction, the light amount incident on the photo-electric sensor 70 is gradually decreased, and, the light amount incident on the photo-electric sensor 70 becomes zero when the projected image 90' of the measurement mark 90 is not overlapped with the opening pattern 64.

Figure 7A:
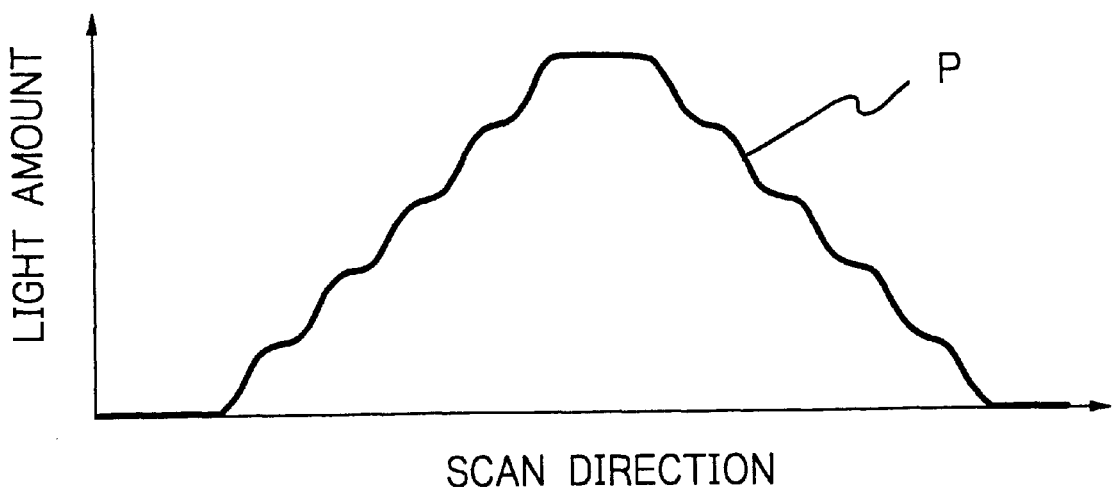
FIG. 7A is a view showing a wave form of a light amount signal obtained from the photo-electric detection of the projected image of the measurement mark of FIG. 5.
Figure 7B:
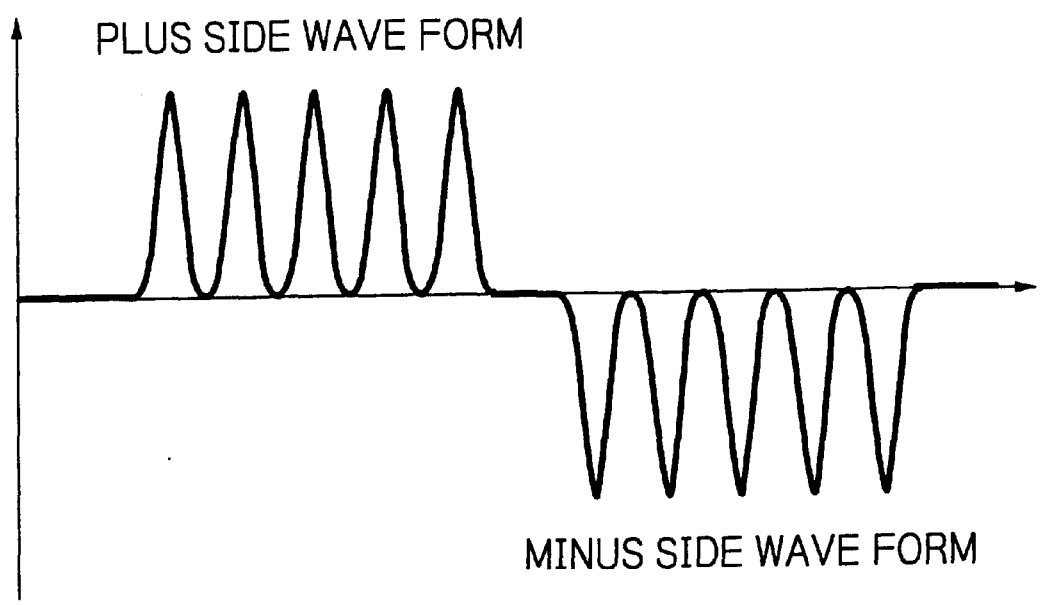
FIG. 7B is a view showing differential wave forms of FIG. 7A.

The change in light amount in this case is shown in FIG. 7A. In the main control device 26, differential wave forms as shown in FIG. 7B are calculated by differentiating a wave form of the light amount signal P shown in FIG. 7A (which is actually digital data taken at predetermined sampling interval) in a scan direction. As apparent from FIG. 7B, in a condition that a front edge (in the scan direction) of the opening pattern 64 is being crossing the projected image 90' of the measurement mark, the light amount is gradually increased (namely, the differential wave form appears at a plus side). To the contrary, in a condition that a rear edge (in the scan direction) of the opening pattern 64 is being crossing the projected image 90' of the measurement mark 90, the light amount is gradually decreased (namely, the differential wave form appears at a minus side).

In the main control device 26, known signal treatment such as Fourier transform is performed on the basis of the differential wave forms shown in FIG. 7B, thereby detecting the projected optical image (spatial image) of the measurement mark 90.

By detecting the projected images (spatial images) of a plurality of measurement marks formed on the reticle R by using such a detecting method, the imaging feature of the projection optical system PL such as magnification or distortion can be sought (a method for seeking the imaging feature will be described later). In the above detecting method, since the projected image 90' of the measurement mark 90 is detected directly, the optical characterisitcs of the projection optical system PL including the magnification and distortion can also be observed.

Next, the detection sequence for detecting the projected images of the plurality of measurement marks formed on the reticle R will be explained.

Here, an example that six measurement marks (mark patterns) 90a–90f formed on the reticle R as shown in FIGS. 8A to 8F are successively measured will be described.

First of all, by the main control device 26, the blind 20 is driven by the drive mechanism 36 so that an area near a measurement mark 90a disposed on the reticle R at a right upper end thereof is defined as an illumination area 102.

Figure 8A:
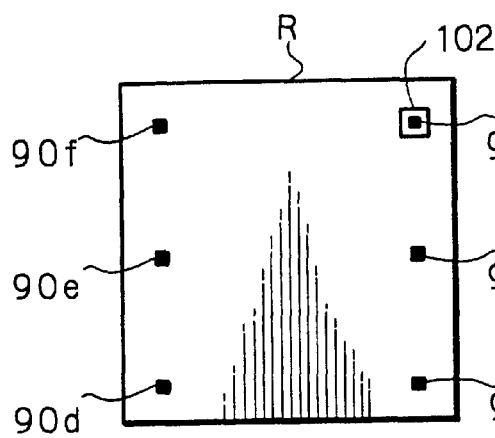
FIGS. 8A to 8F are views for explaining a detection sequence for detecting projected images of a plurality of measurement marks on the reticle.
Figure 8D:
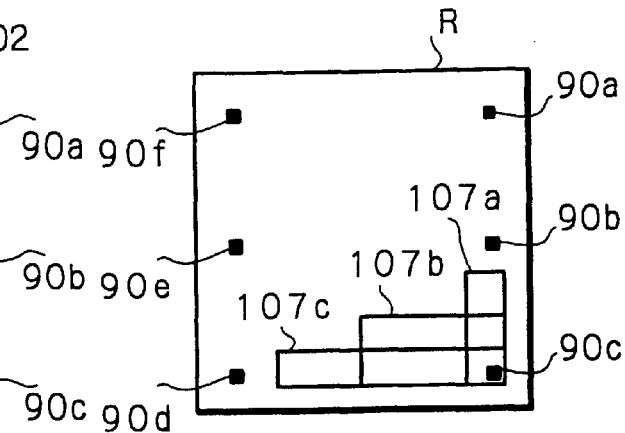

Then, the projected image of the measurement mark 90a passed through the projection optical system PL is detected by the above-mentioned detecting method. During the detection, by the main control device 26, the blind 20 is driven by the drive mechanism 36 so that a limited area including a measurement mark 90b (next measured point) is defined as the illumination area, thereby enlarging the illumination area. That is to say, by the main control device 26, the blade 76d of the blind 20 is shifted in–Y direction by a predetermined amount so that the illumination area 102 shown in FIG. 8A is changed to the illumination area 103 shown in FIG. 8B.

Figure 8B:
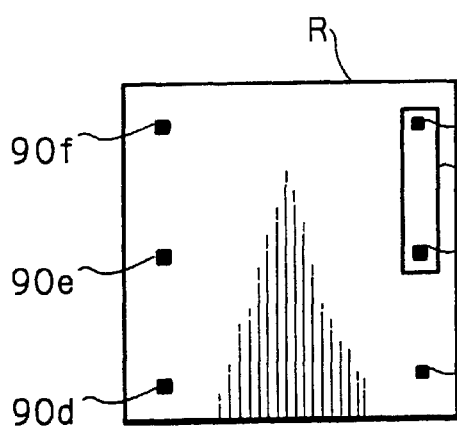
Figure 8E:
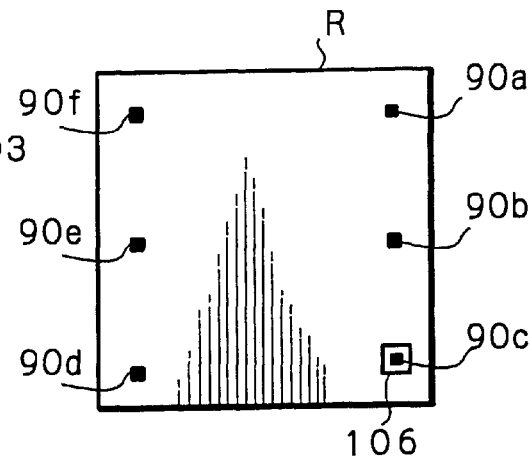
Figure 8C:
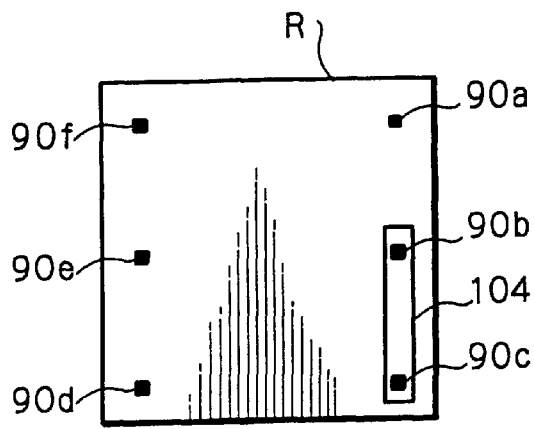
Figure 8F:
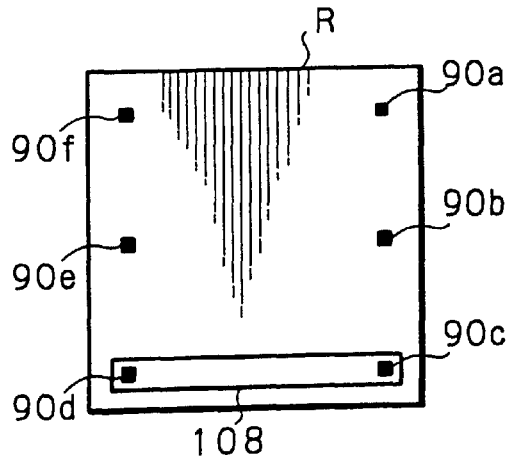

After the projected image of the measurement mark 90a is detected, the detection of the projected image of the measurement mark 90b is started. While the projected image of the measurement mark 90b is being detected by the above-mentioned detecting method, the blind 20 is driven by the drive mechanism 36 so that a limited area including a measurement mark 90c (next measured point) is defined as the illumination area. That is to say, by the main control device 26, the blind 20 is driven so that the illumination area 103 shown in FIG. 8B is changed to the illumination area 104 shown in FIG. 8C. The changing of the illumination area in this case may be performed by driving the blades 76c, 76d in-Y direction at the same speed by the same amount so that the illumination area is transferred from the illumination area 103 to the illumination area 104 as the dimension is unchanged or may be performed by driving the blade 76c in-Y direction by a predetermined amount and then by driving the blade 76d in-Y direction by the same amount so that, after the illumination area is reduced once to illuminate only the measurement mark 90b and the vicinity, the illumination area is enlarged to obtain the illumination area 104.

After the projected image of the measurement mark 90b is detected, the detection of the projected image of the measurement mark 90c is started. When the detection of the projected image of the measurement mark 90c is started, as mentioned above, the illumination area 104 is defined by the blind 20. And, by the main control device 26, while the projected image of the measurement mark 90c is being detected by the above-mentioned detecting method, the blind 20 is driven to change the illumination area (i.e., to change the illumination area 104 to an illumination area 108 shown in FIG. 8F) so that a measurement mark 90d (next measured point) is also illuminated. In this case, by the main control device 26, the blind 20 may be driven in such a manner that, after the illumination area is reduced once to obtain an illumination area 106 shown in FIG. 8E in which only the measurement mark 90c (and the vicinity) is illuminated, the illumination area is changed to the illumination area 108, or, the blind 20 may be driven in such a manner that, after the illumination area 104 is successively changed to illumination areas 107a→107b→107c shown in FIG. 8D, the illumination area is finally changed to the illumination area 108. In the former case, the changing of the illumination area can be realized by driving the blade 76c alone in—Y direction by a predetermined amount and then by driving the blade 76a in+Z direction by a predetermined amount, and, in the latter case, the changing of the illumination area can be realized by driving the blade 76c in-Y direction at a predetermined speed and at the same time by driving the blade 76a in+Z direction at a predetermined speed. In the latter case, since the blades 76c and 76a are driven simultaneously, the illumination area can be changed from the illumination area 104 to the illumination area 108 at a minimum time period.

Thereafter, the projected images of measurement marks 90d, 90e, 90f are successively detected in the similar manner. And, during the detection of the projected images of the measurement marks 90d, 90e, the illumination area is enlarged to the next measurement mark position.

Next, a method for changing the illumination area in a case where an array of the measurement marks is inclined with respect to the Y-axis direction and the X-axis direction on the surface of the reticle corresponding to the Y-axis direction and the Z-axis direction along which the blind is driven will be explained with reference to FIGS. 9A to 9C.

Figure 9A:
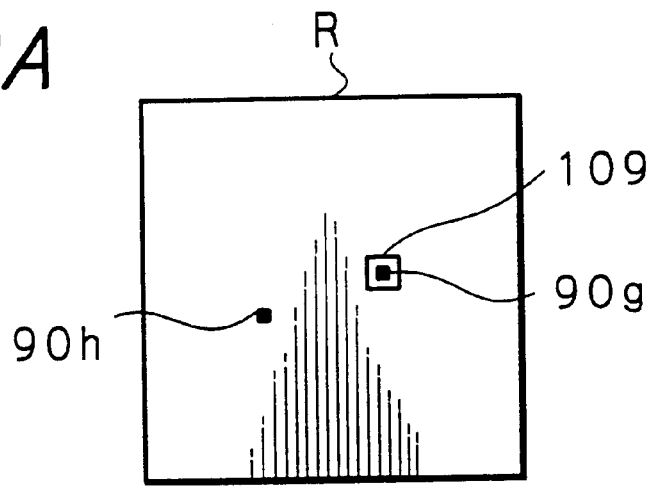
FIGS. 9A to 9C are views for explaining a method for changing an illumination area when an array of the measurement marks on the reticle is inclined with respect to X and Y axes.

There is the following two methods for enlarging the illumination area up to a next measurement mark 90h (next measured point) while a projected image of a measurement mark 90g is being detected by illuminating an illumination area 109 shown in FIG. 9A.

Figure 9B:
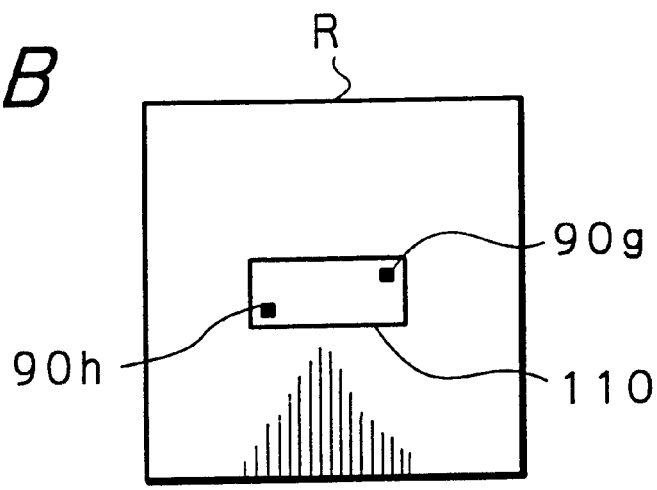
Figure 9C:
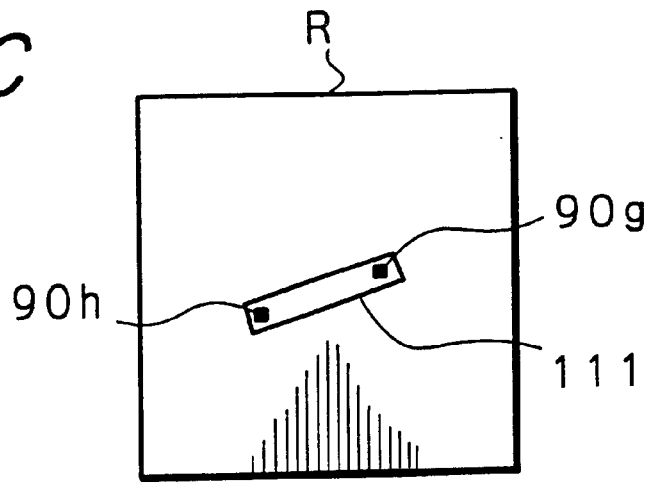

In the first method, as shown in FIG. 9B, the illumination area is changed to a rectangular illumination area 110 in which both of the measurement marks 90g, 90h are illuminated. In the second method, as shown in FIG. 9C, the illumination area is changed to an oblique elongated rectangular illumination area 111 including the measurement marks 90g, 90h. The first method can be realized by driving the blade 76d in-Y direction by a predetermined amount and by driving the blade 76a in+Z direction by a predetermined amount, and, the second method can be realized, for example, by driving the blade 76a in+Z direction by a predetermined amount and by rotating the circular member 72 by a predetermined angle by driving the motor 80 forming a part of the drive mechanism 36. The first method can be realized by a simple movable blind having no rotating mechanism. In the second method, since the illumination area can be made smaller than that in the first method, excessive area is not illuminated by the illumination light to prevent the projection optical system PL, reticle R and wafer holder 52 from absorbing the illumination light, thereby preventing the imaging feature from being worsened.

Next, a method for measuring change in magnification (as an example of the imaging feature) and a method for correcting the magnification will be explained with reference to FIGS. 10A to 10H.

Figure 10A:
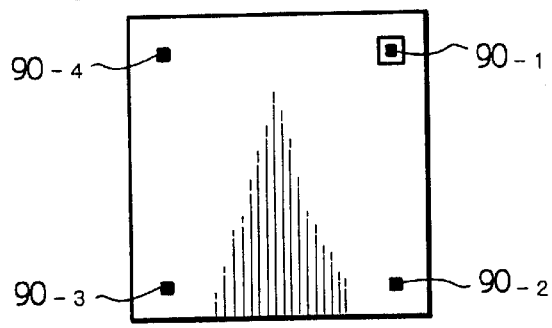
Figure 10H:
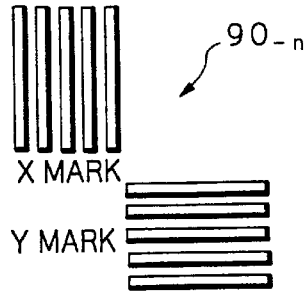
FIG. 10H is a view showing the measurement marks in detail.
Figure 10H:
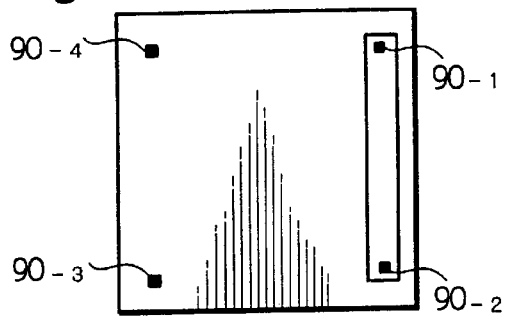
Figure 10G:
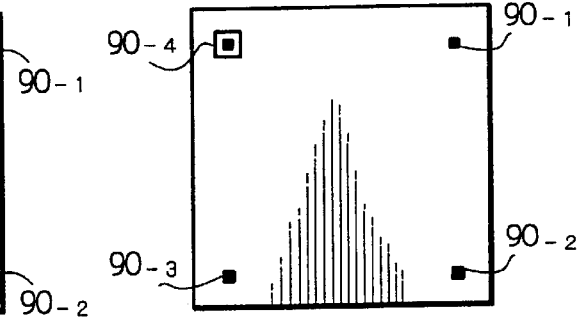
Figure 10G:
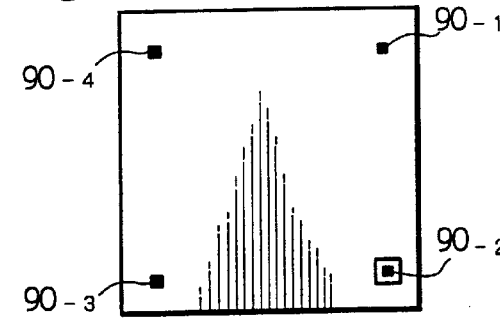
Figure 10G:
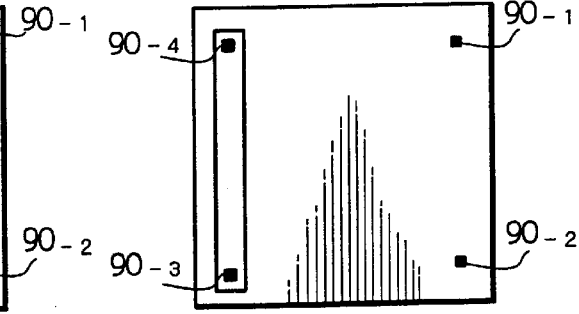
Figure 10G:
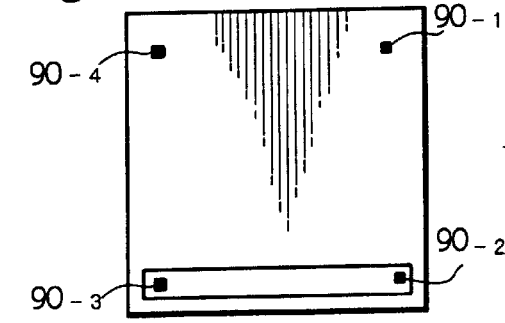
Figure 10G:
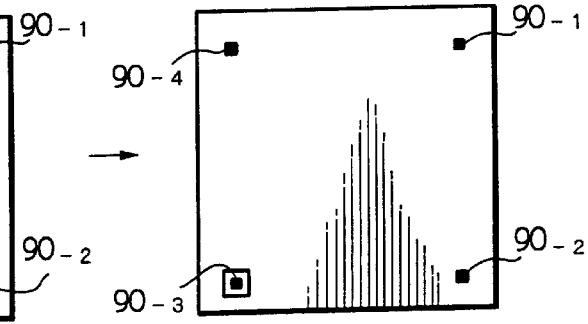

Here, it is assumed that four measurement marks $90_{-1} \sim 90_{-4}$ are formed on the reticle R. As shown in FIG. 10H, each measurement mark $90_{-n}$ (n=1~4) comprises an X mark and a Y mark.

In this case, similar to the aforementioned measurement sequence, projected images of the measurement marks $90_{-1} \sim 90_{-4}$ are successively detected by the above-mentioned detecting method. By the main control device 26, the drive mechanism 36 is controlled so that, as the projected images of the measurement marks $90_{-1}$, $90_{-2}$, $90_{-3}$, $90_{-4}$ are successively detected, the illumination area is changed or transferred as shown by the white rectangular areas in the order of FIGS. 10A→10B→11C→10D→10E→10F→10G.

When the projected images of the measurement marks $90_{-1} \sim 90_{-4}$ are sought in this way by using such a measurement sequence, by the main control device 26, measured values $(X_i, Y_i)$ (i=1~4) in the XY coordinate system of the measurement marks 90-1~90-4 are sought on the basis of the projected images, and, an absolute value $\Delta X_1$ of the difference between the values X4 and X1, an absolute value $\Delta X_2$ of the difference between the values X3 and $X_2$, an absolute value $\Delta X_3$ of the difference between the values $X_4$ and $X_2$, an absolute value $\Delta X_4$ of the difference between the values $X_1$ and $X_3$, an absolute value $\Delta Y_1$ of the difference between the values $Y_4$ and $Y_3$, an absolute value $\Delta Y_2$ of the difference between the values $Y_1$ and $Y_2$, an absolute value $\Delta Y_3$ of the difference between the values $Y_4$ and $Y_2$, and an absolute value $\Delta Y_4$ of the difference between the values $Y_1$ and $Y_3$ are calculated, respectively, on the basis of the measured values, and, deviation $\Delta M_{xi}$ of magnification in the X direction and deviation $\Delta M_{yi}$ of magnification in the Y direction are calculated on the basis of the following equations (1) and (2) by using the difference absolute values $\Delta_{xi}$, $\Delta_{yi}$ (i=1~4) and design values $\Delta X_{p1}$, $\Delta X_{p2}$, $\Delta X_{p3}$, $\Delta X_{p4}$ and $\Delta Y_{p1}$, $\Delta Y_{p2}$, $\Delta Y_{p3}$, $\Delta Y_{p4}$ corresponding to these difference absolute values:

$$\Delta M_{xi} = \Delta_{xi}/\Delta X_{pi} (i=1\sim4) \quad (1)$$

$$\Delta M_{yi} = \Delta Y_i/\Delta Y_{pi} (i=1\sim4) \quad (2)$$

And, in the main control device 26, the change, $\Delta M$ in magnification is calculated on the basis of the following equation (3):

$$\Delta M = (\Sigma \Delta M_{xi} + \Sigma \Delta M_{yi})/8 \quad (3)$$

In the above equation (3), "$\Sigma$" is the sum when "i" is changed to 1, 2, 3 and 4, respectively.

By the main control device 26, a command value for the change amount of internal pressure for correcting the magnification change ΔM is applied to the imaging feature correction controller 48, with the result that, in the imaging feature correction controller 48, the internal pressure of the closed chamber 49 is changed to correct the magnification change ΔM. In this way, the measurement and correction of the magnification change are finished.

In case of FIGS. 10A to 10H, since each measurement mark comprises the X mark and the Y mark (extending in two directions), as mentioned above, the X direction magnification deviation $\Delta M_{xi}$ and the Y direction magnification deviation $\Delta M_{yi}$ can be measured, respectively, and, not only the magnification but also the distortion can be measured by using these data suitably. Further, by combining measurement marks extending in the oblique directions with respect to the X and Y measurement marks, an S image and an M image can be detected regarding the projection optical system PL. In this case, however, it is necessary that the opening pattern 46 and the scan direction of the wafer stage 50 are inclined in correspondence to the angle of the measurement mark.

As apparent from the foregoing explanation, in the illustrated embodiment, a relative shift device is constituted by the drive system 54 and the stage controller 58, and the device control device 26 provides a control device and a calculation device.

As mentioned above, according to the projection exposure apparatus 10 of the illustrated embodiment, while the projected image (spatial image) of a certain measurement mark (mark pattern) on the reticle R passed through the projection optical system PL is being detected, the illumination area is enlarged up to the next measurement mark position. Therefore, in case of a plural measurement marks, the time period during which the blind is driven whenever the measurement point is shifted or changed can substantially be lowered, thereby preventing the reduction of the through-put due to the changing of the illumination area to maintain high through-put. Further, since the illumination area is limited to the area near the measurement mark, the deterioration of the imaging feature due to the absorption of illumination light of the reticle R and projection optical system PL can be suppressed as much as possible.

In the illustrated embodiment, since the integrated data of the spatial image is directly measured by using the substantially square opening pattern as the opening pattern 64 forming a part of the photo-electric sensor unit 100, it is sufficient if the entire profile of the measurement mark is substantially coincident with the opening pattern, so that the measurement can be effected regardless of a line width and the number of lines of the measurement mark. In this case, since the obtained light amount signal is not averaged unlike to the case where the slit-shaped opening pattern is provided, the signal substantially corresponding to the actual image can be obtained.

According to the illustrated embodiment, regarding the construction of the photo-electric sensor unit 100, while an example that the photo-electric sensor 70 is disposed within the wafer stage 50 is explained, for example, it should be understood that the received illumination light may be sent to a photo-electric sensor disposed outside the wafer stage 50 through a light sending optical system such as an optical fiber bundle or a relay optical system. In such a case, since the photo-electric sensor 70 can be disposed outside the wafer stage 50, inconvenience in which the position controlling accuracy for the wafer stage 50 is worsened by the heat generated by the photo-electric sensor 70 can be avoided. In this case, however, the optical system must be arranged to permit the measurement at any position on the reticle R.

In the illustrated embodiment, while an example that each measurement mark formed on the reticle R comprises five L/S patterns is explained, the mark pattern according to the present invention may comprise a single line pattern, pattern having 2–4 lines, or pattern having more than five lines.

In the illustrated embodiment, while an example that the single square opening pattern is used as the opening pattern 64 formed on the light receiving glass 62 is explained, the present invention is not limited to such an example, but, for example, an opening pattern having the same configuration as the measurement mark 90 on the reticle R may be used as shown in U.S. Pat. No. 5,650,840. Of course, the number of lines in the L/S patterns can be selected appropriately.

Figure 11A:
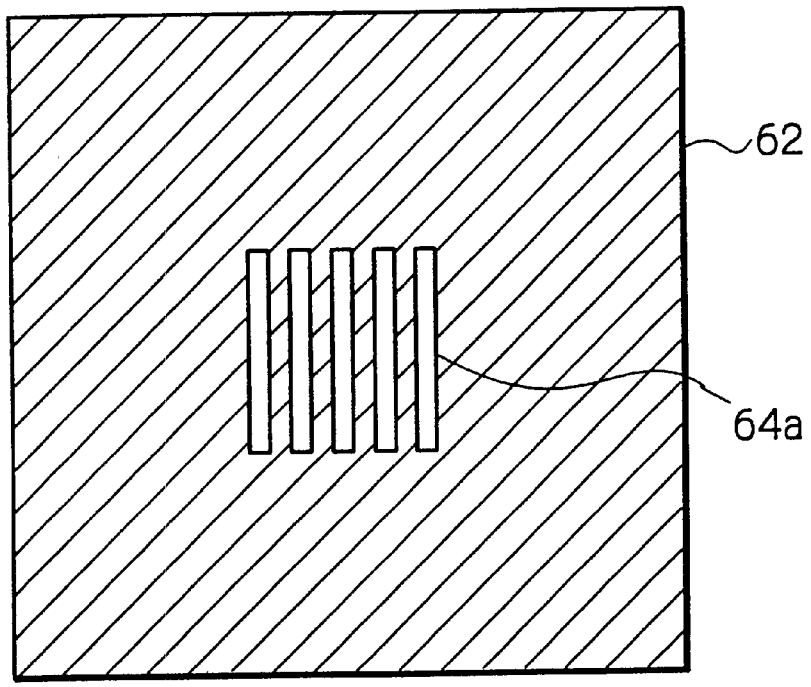
FIG. 11A is a view showing another example of an opening pattern formed on a light receiving glass plate forming a part of a photo-electric sensor unit.
Figure 11B:
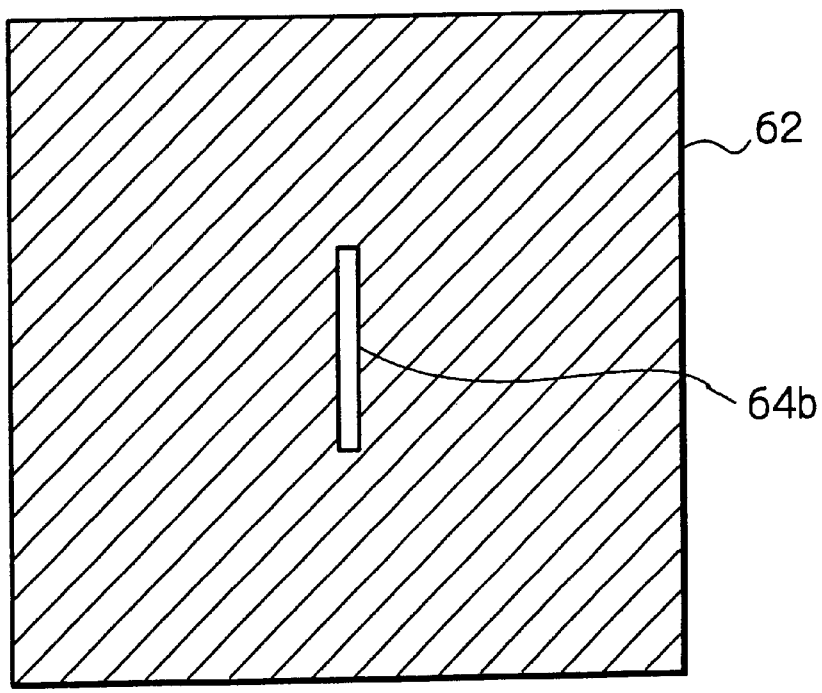
FIG. 11B is a view showing a further example of an opening pattern formed on the light receiving glass plate.
Figure 12A:
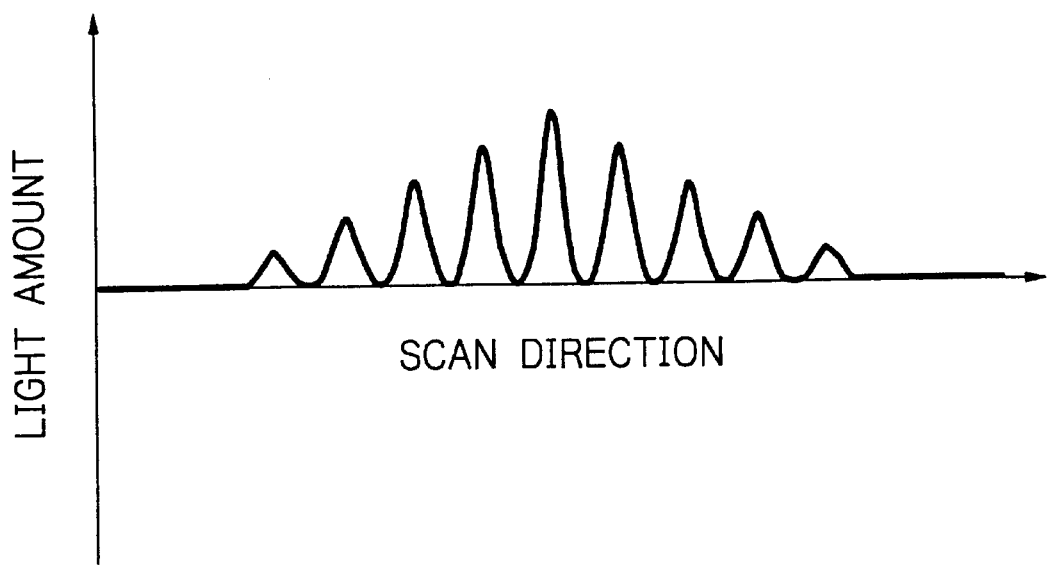
FIG. 12A is a view showing a light amount signal obtained when the projected image of the measurement mark 90 is detected by using the opening pattern of FIG. 11A.
Figure 12B:
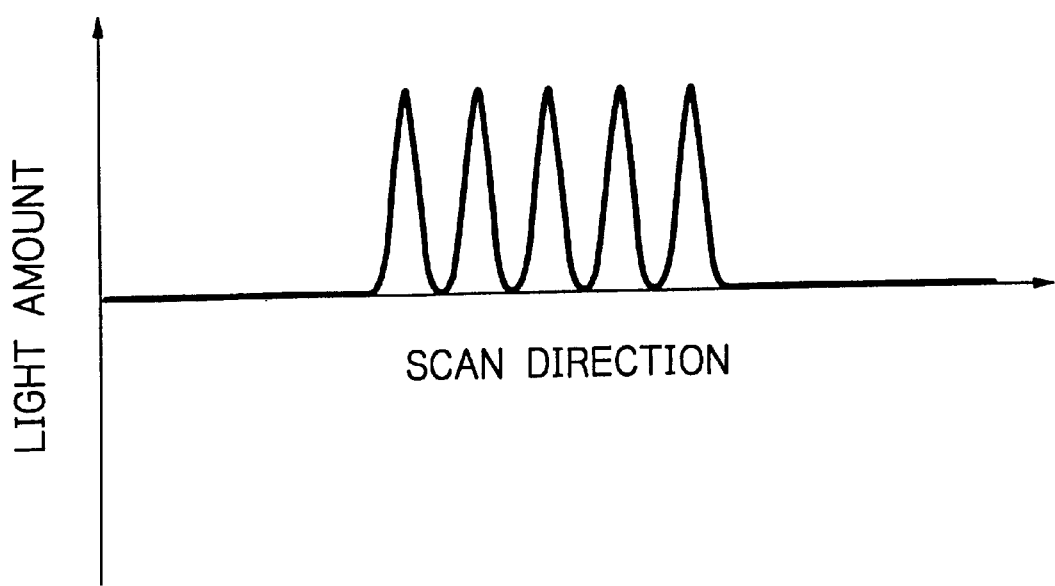
FIG. 12B is a view showing a light amount signal obtained when the projected image of the measurement mark 90 is detected by using the opening pattern of FIG. 11B.

That is to say, as shown in FIG. 11A, an opening pattern 64a comprised of five slits may be formed on the light receiving glass plate 62, or, as shown in FIG. 11B, an opening pattern 64b comprised of a single slit may be formed on the light receiving glass plate 62. In such cases, the light amount signals obtained when the projected image of the measurement mark 90 passed through the projection optical system PL is detected in a similar manner to the manner described above take forms as shown in FIGS. 12A and 12B, respectively. In such cases, it is not required to perform the differentiation along the scan direction, and, data treatment such as Fourier transform can be effected as it is. In the case where the opening pattern 64a as shown in FIG. 11A is used, even when the measurement mark 90 and the opening pattern 64a have five lines, eleven wave forms as shown in FIG. 12A can be detected. Therefore, the averaging effect can be expected. On the other hand, in the case where the opening pattern 64b as shown in FIG. 11B is used, even if the width of the opening pattern is different from the line width of the measurement mark 90 more or less, the mark can be detected.

In the illustrated embodiment, while an example that the positions of the projected image (optical iimage) of the measurement mark in the XY coordinate system are detected to seek the imaging feature such as magnification is explained, the present invention is not limited to such an example, but, for example, focus can be measured by changing the relative distance between the wafer stage 50 and the reticle R step by step by driving-the wafer stage 50 in the Z direction in a stepping manner, and by detecting the optical image at the respective step positions and by comparing the contrasts between the detected images.

It is also possible to determine telecentricity of the projection optical system PL by successively placing the opening pattern 64 in a plurality of positions along the optical axis AX (in Z-axis) of the projection optical system PL, moving the wafer stage 50 in a predetermined direction (X-axis direction, for example) in the respective positions and measuring the position of the projected image of the measuring mark in this predetermined direction in each of the plurality of the positions.

It is also possible to determine astigmatism of the projection optical system PL by providing two L/S patterns disposed respectively in the sagittal direction (S-direction) and the meridional direction (M-direction) in an image field of the projection optical system PL, successively placing these patterns in predetermined points in the image field and measuring focus position at these points using these two L/S patterns.

It is also possible to determine aberrations other than distortion (for example, curvature of field and decentration coma) of the projection optical system PL by providing measurement marks at a plurality of points in the image field of the projection optical system PL by forming a plurality of measuring marks on a reticle R or successively moving the reticle R and measuring the focus position at these points.

Furthermore, as shown in U.S. Pat. No. 5,650,840, it is also possible to measure the focus position by moving the wafer stage 50 (opening pattern 64) in a predetermined direction (X-axis, for example) in a plane (X-Y co-ordinate system) perpendicular to the optical axis AX of the projection optical system PL, simultaneously moving the wafer stage 50 (opening pattern 64) also in a Z-axis along the optical axis of the projection optical system and conducting differentiation operation on the signal outputted from the photo-electric sensor 70 during the movements.

It is also possible to determine aberrations other than distortion of the projection optical system PL (at least one of curvature of field, astigmatism, coma and spherical aberration) and correct the determined aberration by moving at least one of a plurality of lens elements of the projection optical system PL (except for the lens elements 40$a$, 40$b$ used for adjusting magnification and distortion). It is also possible to adjust decentration coma by slanting a parallel plane plate provided on the image side of the projection optical system PL. Furthermore, as to aberrations of the projection optical system PL, especially components of axial asymmetry, the adjustment therefor may be achieved by exchanging at least one optical elements disposed between the reticle R and the wafer W. It is also possible to adjust distortion of axial asymmetry by replacing a parallel plane plate having a partly different thickness on the object side of the projection optical system PL with another parallel plane plate with a different forming condition.

In the illustrated embodiment, while an example that the projected image of the measurement mark on the reticle is detected photo-electrically while shifting the wafer stage 50 is explained, the present invention is not limited to such an example, but, for example, the projected image of the measurement mark on the reticle may be detected photo-electrically while shifting the reticle R by providing a drive mechanism associated with the reticle R. In this case, the illumination area must be determined so that the illumination light is sufficiently projected on the measurement mark 90 even when the reticle R is shifted. In this case, so long as the projected image of the measurement mark formed on the reticle R can be detected by the opening pattern (sensor opening) provided on the wafer stage 50, the imaging feature correcting method according to the present invention can be applied effectively.

As mentioned above, according to the first embodiment, the changing of the illumination area does not impose a bad influence upon the through-put and the change in the imaging feature due to the absorption of the illumination light of the mask and the projection optical system can be suppressed as much as possible, which could not be obtained in the conventional techniques.

Figure 13:
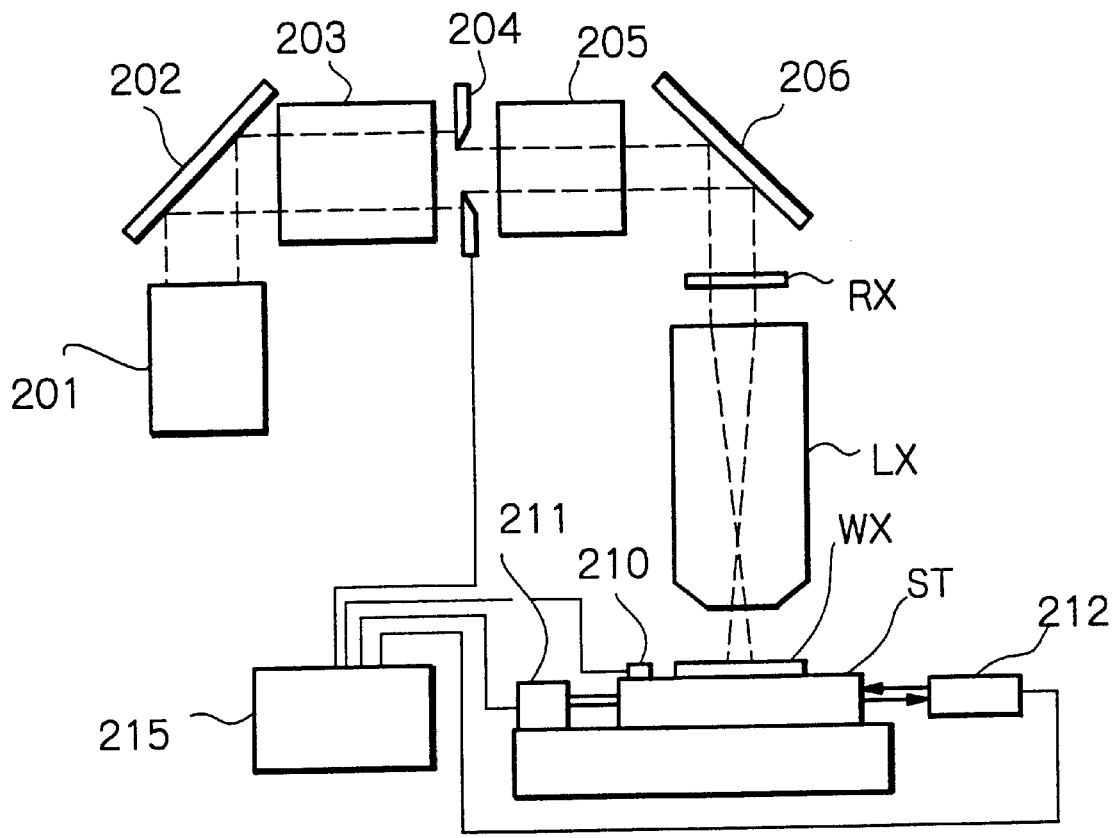
FIG. 13 is a schematic view of a projection exposure apparatus according to a second embodiment of the present invention.

FIG. 13 shows an exposure apparatus according to a second embodiment of the present invention. This exposure apparatus is an exposure apparatus of reduction-projection type (so-called wafer stepper) in which a pattern image formed on a reticle RX (as a mask) is projected onto shot areas of a wafer W as a photosensitive substrate through a projection optical system LX in a step-and-repeat manner.

The exposure apparatus includes an illumination system (as illumination means) having a light source 201, a reticle stage (not shown) for holding a reticle RX, a projection optical system LX for projecting a pattern image formed on the reticle RX onto a wafer WX, a wafer stage ST for holding the wafer WX, and a controller 215.

The illumination system includes the light source 201 comprised of an excimer laser or a high voltage mercury lamp, a fly-eye lens 203, and a variable blind (as a field stop) 204 for defining an illumination field of illumination light, i.e., an illumination area on the reticle RX and for shielding illumination light flux.

A mirror 202 is disposed in a light path of the illumination light from the light source 201, and the fly-eye lens 203 and the variable blind 204 are disposed behind the mirror. The plane of the variable blind 204 is in conjugation with the pattern surface of the reticle RX and an exposure plane to which the wafer WX is aligned, so that the illumination area on the pattern surface of the reticle RX and on the exposure plane can freely be set by changing the position and shape of the aperture by opening or closing alight shield member of the variable blind 204 by means of a drive mechanism.

Figure 18:
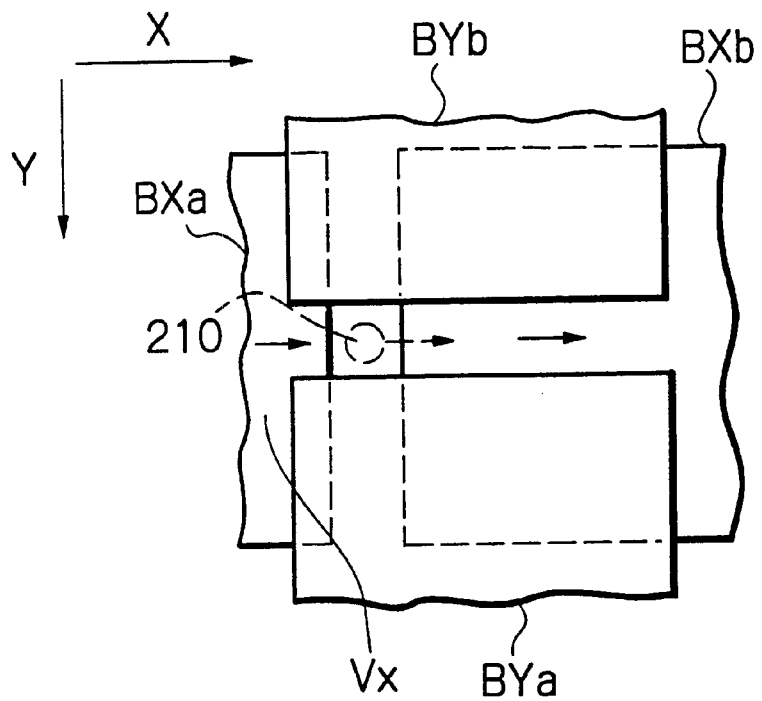
FIG. 18 is a view showing an operation of a blind in the first example.
Figure 20:
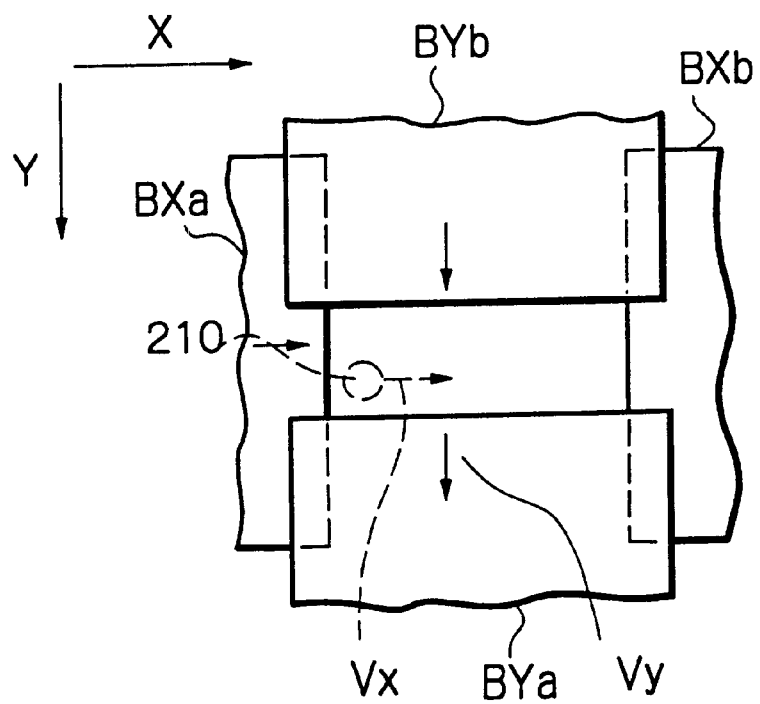
FIG. 20 is a view showing an operation of a blind in the second example.

A s show n in FIGS. 18 and 20, the variable blind 204 includes light shield members BXa, BXb, BYa and BYb. The light shield members BXa, BXb are driven in an X direction, and the illumination area in the X direction is defined by the illumination light passed between edge portions of these two light shield members. Further, the light shield members BXa, BXb are controlled independently. The light shield members BYa, BYb are driven in a Y direction, and the illumination area in the Y direction is defined by the illumination light passed between edge portions of these two light shield members. Further, the light shield members BYa, BYb are controlled independently. Thus, an opening portion (aperture) of the variable blind 204 can be set to any rectangular shape (including dimension). By driving the light shield members BXa, BXb, BYa and BYb continuously, the opening portion of the variable blind 204 can be shifted continuously with any shape.

A condenser lens 205 and a mirror 206 are disposed in the light path of the illumination light behind the variable blind 204, so that the illumination light passed through the variable blind 204 is directed onto the reticle RX via the condenser lens 205 and the mirror 206.

Returning to FIG. 13, the illumination light passed through the reticle RX is incident on the projection optical system LX.

The projection optical system LX is an optical system of reduction-projection type having bilateral telecentric arrangement.

The wafer stage ST is disposed below the projection optical system LX. The wafer WX is secured to the wafer stage ST in a vacuum suction manner. The wafer stage ST is actually constituted by an XY stage which can be shifted two-dimensionally in a horizontal plane (XY plane) and a Z stage which is mounted on the XY stage and can be shifted minutely in the optical axis direction (Z direction), and, in FIG. 13, such a wafer stage ST is illustrated. In the following explanation, it is regarded that the wafer stage ST is driven two-dimensionally in the XY direction by a drive system 211 and is also driven minutely in the optical axis direction within a small range (for example, about 100 $\mu$m). With this arrangement, each of the shot areas on the wafer WX can be positioned on the exposure plane.

A two-dimensional position of the wafer stage ST is always detected with resolving power of about 0.01 $\mu$m, for example, by a laser interferometer 212 through a shift mirror secured to the wafer stage ST, and output from the laser interferometer 212 is sent to the controller 215 which controls the drive system (motor) 211. By using such a closed loop control system, for example, the wafer stage ST is shifted to a next shot position in a stepping manner after the pattern of the reticle RX was transferred for exposure onto one of shot areas on the wafer WX.

Figure 14:
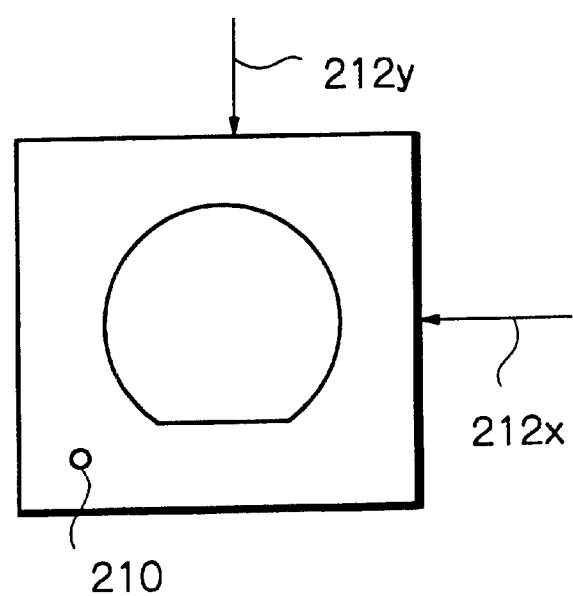
FIG. 14 is a schematic view showing a stage and an interferometer in the embodiment of FIG. 13.

FIG. 14 schematically shows the wafer stage ST viewed from above. The wafer stage is provided with interferometers for X and Y directions. To this end, laser interferometers 212x and 212y are provided. Although not shown, regarding the drive system, motors for X and Y axes are provided in association with the laser interferometers. The wafer is held on the wafer stage ST at its central position, and an illuminometer 210 (described later) is disposed beside the wafer.

Figure 15:
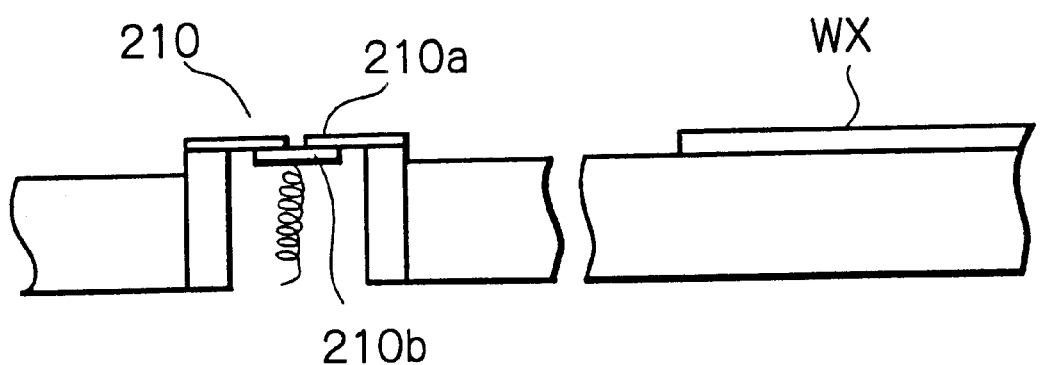
FIG. 15 is an enlarged view of an illuminometer in the embodiment of FIG. 13.

FIG. 15 is an enlarged partial sectional view showing the illuminometer 210. The illuminometer 210 as a photoelectric conversion device is disposed on the wafer stage ST.

The illuminometer 210 includes a window member 210a having a window (pinhole) for passing a part of light flux of the illumination light and having a diameter of about 0.5 mm, and a photo-electric sensor 210b for receiving light passed through the pinhole of the window member 210a to measure light intensity. A light receiving surface of the photo-electric sensor 210b of the illuminometer 210 substantially coincides with the upper surface of the wafer.

The controller 215 serves to perform position control of the wafer stage ST, drive control of the variable blind 204, and calculation and storing of an output signal from the illuminometer 210 (described later). The controller 215 further serves to control measurement of light intensity distribution of the illumination light by controlling such elements.

Next, a method for measuring the light intensity distribution of the illumination light on the exposure plane by using the illuminometer 210 according to the second embodiment will be explained.

When the light intensity distribution of the illumination light on the exposure plane is measured, the light receiving surface of the photo-electric sensor 210b of the illuminometer 210 is aligned with the exposure plane, and the illuminometer is shifted continuously or steppingly within a predetermined measurement range where the light intensity distribution is measured so that the light intensity of the illumination light can be measured at a plurality of positions within the measurement range.

The measurement range for the light intensity distribution according to the illustrated embodiment is an area on which the pattern image of the reticle RX is projected through the projection optical system LX and has a shape (dimension) substantially the same as that of any one of the shot areas on the wafer WX. In FIG. 13, the reticle RX is positioned in the light path of the illumination light. However, when the light intensity distribution of the illumination light is measured, the reticle RX is removed from the light path of the illumination light.

During the measurement of the light intensity distribution of the illumination light, the variable blind 204 restricts the illumination area of the illumination light flux to an illumination area which is sufficient to measure the light intensity distribution by means of the illuminometer 210 and smaller than the measurement range, and the illumination area is shifted within the measurement range with sufficient area and shape in correspondence to the position and movement of the illuminometer 210.

The opening portion of the variable blind 204 defines the illumination area so that the illumination area becomes greater than the diameter of the pinhole (light receiving window) of the illuminometer 210. If the illumination area is too small, the shade of ends of the light shield members of the variable blind 204 are overlapped with the pinhole of the illuminometer 210, with the result that a measurement value of the light intensity of the illuminometer 210 includes an error. Accordingly, the shape and area of the opening portion of the blind 204 is set so that the measurement is not influenced by such overlapping. That is to say, during the measurement of the light intensity distribution, the opening portion defined between the edges of the light shield members BXa, BXb, BYa, BYb is always maintained to have a predetermined size or more.

The light intensity distribution of the illumination light is determined by combining relative position information of the illuminometer 210 with respect to the measurement range with the light intensity measured by the illuminometer 210 at that position.

The relative position information of the illuminometer 210 with respect to the measurement range is obtained on the basis of a relative positional relation between the position of the illuminometer 210 converted from the position information of the wafer stage ST based on the interferometer 212 and the illumination light flux.

Figure 16:
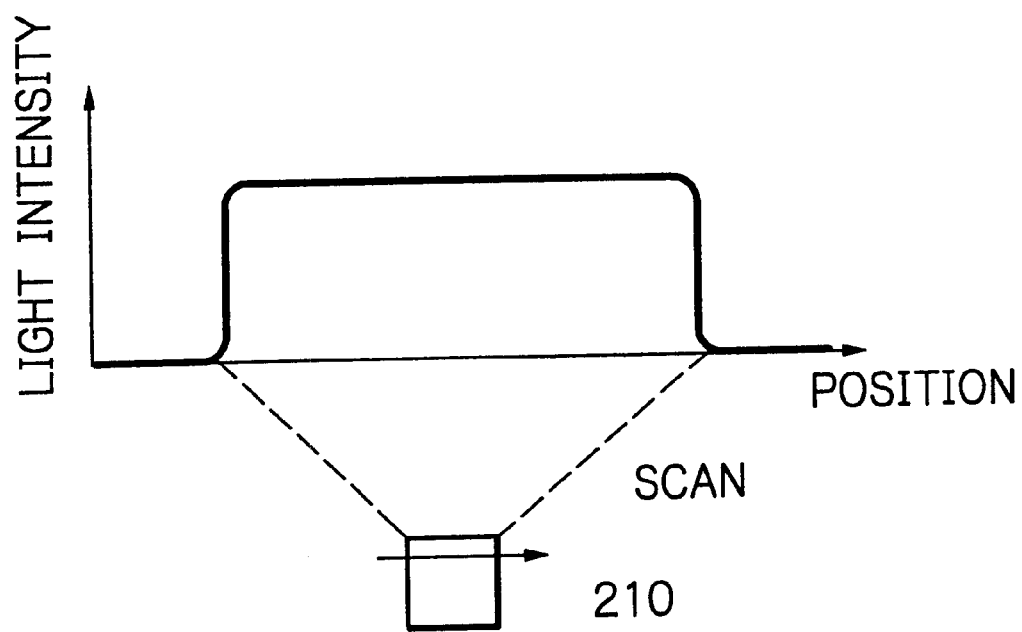
FIG. 16 is a graph showing an example of a relation between a position of the illuminometer and light intensity distribution.

FIG. 16 shows an example of the light intensity distribution obtained when the scanning operation of the illuminometer 210 is effected once (by one time) in the X direction within the measurement range of the light intensity distribution. The light intensity distribution shown in FIG. 16 is obtained by continuously plotting the relative position of the illuminometer 210 in the X direction within the measurement range based on the interferometer 212 and the light intensity from the illuminometer 210, and, by measuring the light intensity distribution while shifting the illuminometer continuously, the measured result representing continuous light intensity distribution is obtained. By effecting continuous shifting of the illuminometer two-dimensionally, two-dimensional light intensity distribution can be obtained within the measurement range of the light intensity distribution of the illumination light.

Figure 17:
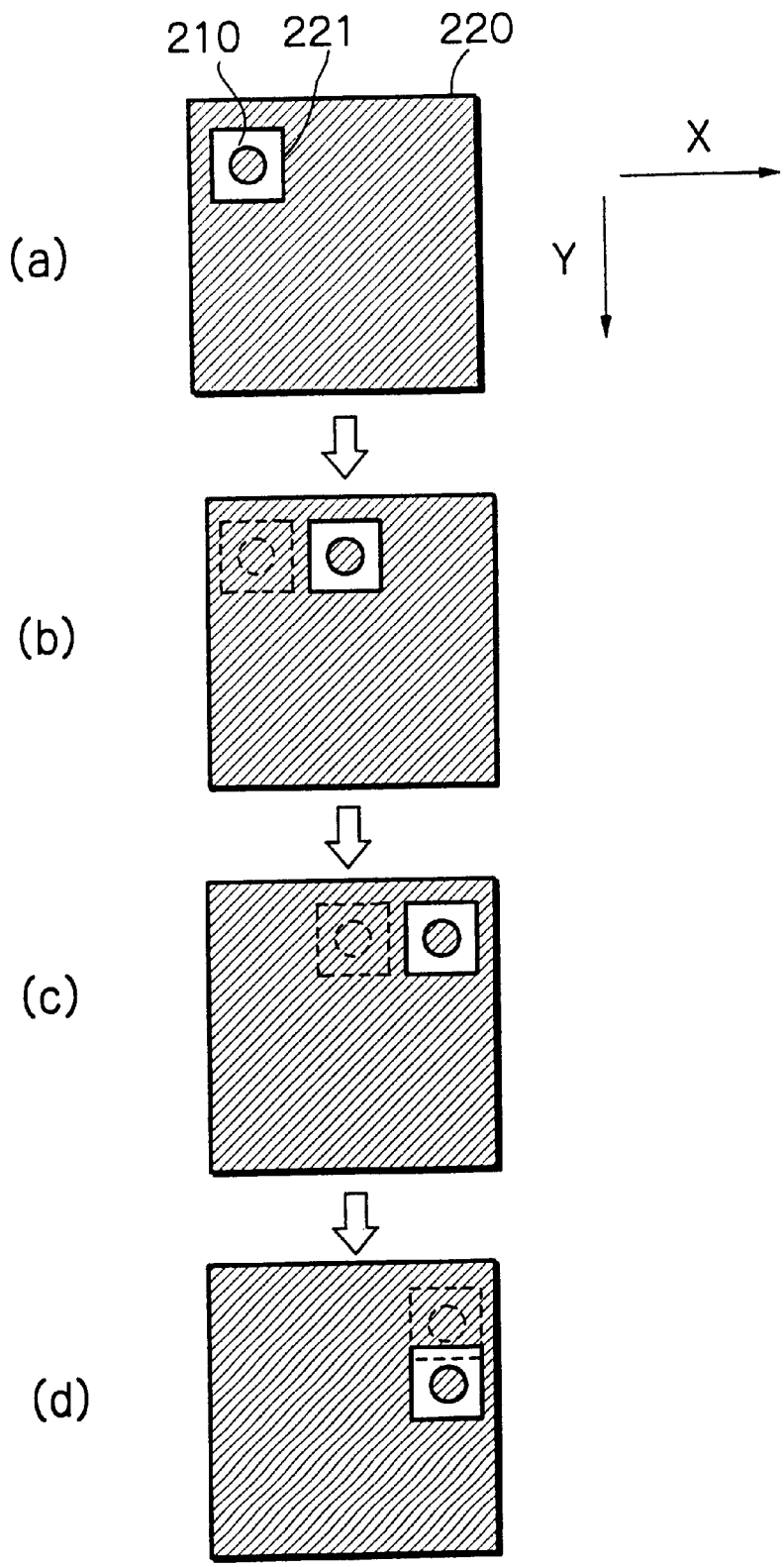
FIG. 17 is a view showing a first example of a method for measuring the light intensity distribution according to the present invention.

FIG. 17 schematically shows a first example of a method for measuring the light intensity distribution by using the illuminometer 210. FIG. 17 shows a flow of measurements of the light intensity distribution within the measurement range 220 of the illumination light flux. In the section (a) of FIG. 17, the measurement of the light intensity distribution is started. Sections (b), (c),and (d) of FIG. 17 show conditions that the illuminometer 210 is shifted by the controller 215 within the measurement range 220.

In the section (b) of FIG. 17, the broken line shows the position of the illuminometer 210 and an illumination area 221 in the condition shown in the section (a) of FIG. 17. Similarly, each of the sections (c) and (d) of FIG. 17 shows the illuminometer 210 and the illumination area 221 in the previous condition. (Incidentally, each of sections (b), (c) and (d) of FIGS. 19, 21 and 23 similarly shows the illuminometer 210 and the illumination area in the previous condition.)

From the condition shown in the section (a) of FIG. 17 to the condition shown in the section (c) of FIG. 17, the illuminometer 210 is shifted in+X direction at a speed of Vs, while measuring the light intensity of the illumination light. Then, from the condition shown in the section (d) of FIG. 17, the illuminometer 210 is shifted in−X direction at the speed of Vs, while measuring the light intensity of the illumination light. By repeating these shifting movements, the light intensity distribution within the measurement range is measured.

At the same time, the illumination area 221 defined by the variable blind 204 controlled by the controller 215 is controlled so that the illuminometer 210 is brought to substantially a center of the illumination area 221, and the position of the illumination area 221 is controlled in accordance with the shifting movement of the illuminometer 210.

Now, the operation of the variable blind 204 in this case will be explained with reference to FIG. 18. For example, from the condition shown in the section (a) of FIG. 17 to the condition shown in the section (c) of FIG. 17, although the illuminometer 210 is shifted at the speed of Vs, when this is converted to the position corresponding to the plane of the variable blind 204, it is assumed that the illuminometer is shifted at a speed of Vx. In synchronous with the shifting movement of the illuminometer 210, the light shield members BXa, BXb of the variable blind 204 are shifted in+X direction at a speed of Vx. After the illuminometer 210 was scanningly moved in+X direction once (condition shown in the section (c) of FIG. 17), the illuminometer 210 is shifted in the Y direction. A shift amount in the Y direction is determined by density of data of the light intensity distribution required. The shifting movement in the Y direction is shown in the sections (c).and (d) of FIG. 17. When the illuminometer 210 is shifted in the Y direction, the light shield members BYa, BYb of the variable blind 204 are shifted in the Y direction while keeping the light shield members BXa, BXb stationary. From the condition shown in the section (d) of FIG. 17, the illuminometer 210 is shifted in−X direction, and the light shield members BXa, BXb are also shifted in−X direction at the speed of Vx. By so shifting the illuminometer 210 and the illumination area 221 within the measurement range 220, the light intensity is measured.

In the first example, the area of the illumination area 221 of the illumination light can be smaller than the measurement range of the light intensity distribution and an amount of the illumination light incident on the projection optical system LX can be reduced. Accordingly, a heat amount absorbed by optical members of the projection optical system LX can be reduced.

Since the controller 215 does not need to control the X direction shifting movements of the light shield members BXa, BXb of the variable blind 204 and the shifting movements of the light shield members BYa, BYb simultaneously, the variable blind 204 can easily be controlled. That is to say, since the light shield members BXa, BXb and the light shield members BYa, BYb are controlled alternately, time periods required for calculation and the setting of the variable blind 204 can be reduced.

Figure 19:
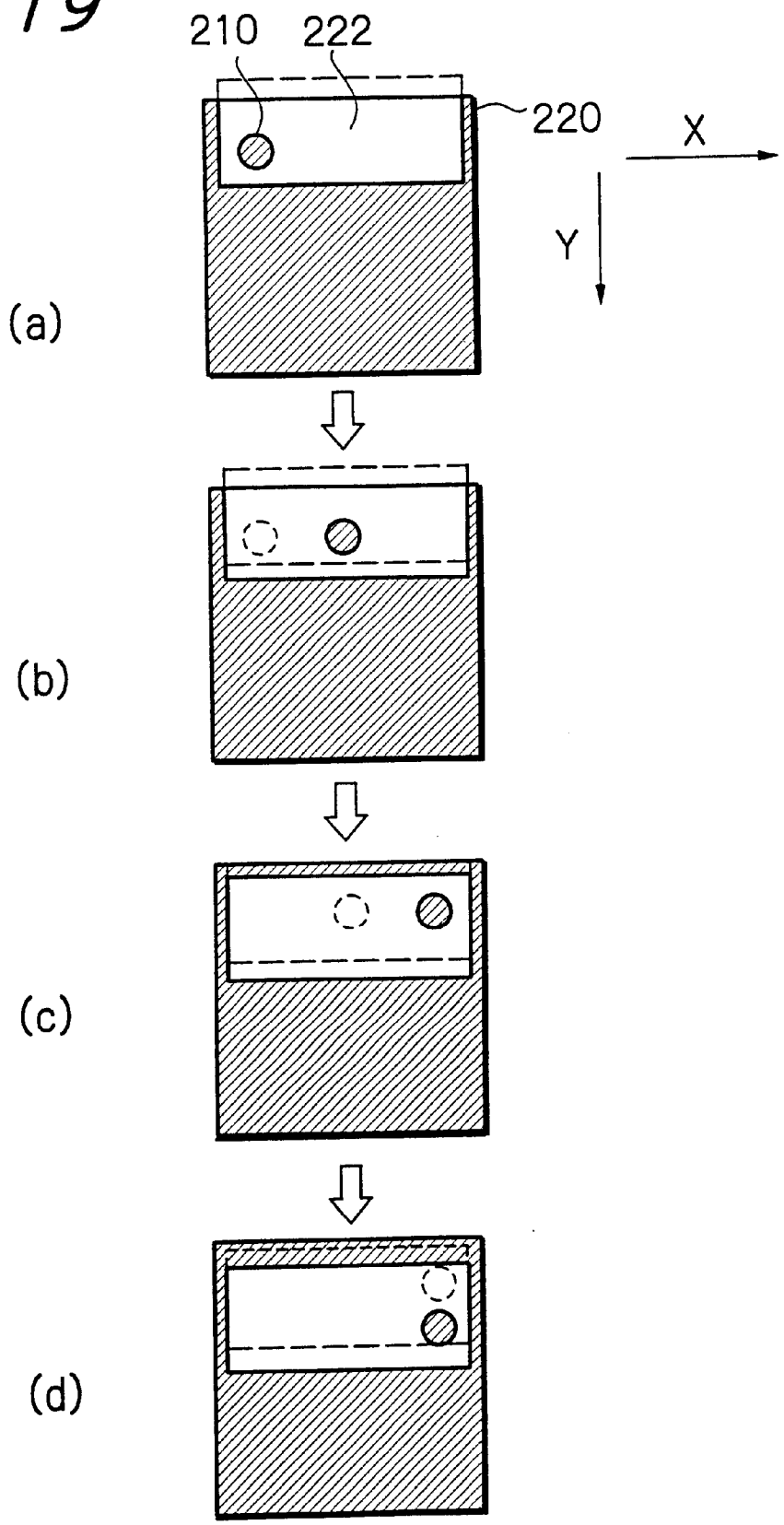
FIG. 19 is a view showing a second example of a method for measuring the light intensity distribution according to the present invention.

FIG. 19 schematically shows a second example of a method for measuring the light intensity distribution by using the illuminometer 210. FIG. 19 shows a flow of measurements of the light intensity distribution within the measurement range 220 (on the exposure plane) of the illumination light flux. In the section (a) of FIG. 19, the measurement of the light intensity distribution is started. Sections (b), (c) and (d) of FIG. 19 show conditions that the illuminometer 210 is shifted by the controller 215 within the measurement range 220.

From the condition shown in the section (a) of FIG. 19 to the condition shown in the section (c) of FIG. 19, the illuminometer 210 is shifted in+X direction at a speed of Vs, while measuring the light intensity of the illumination light. Then, from the condition shown in the section (d) of FIG. 19, the illuminometer 210 is shifted in−X direction at the speed of Vs. By repeating these shifting movements, the light intensity distribution within the measurement range is measured.

At the same time, an illumination area 222 defined by the variable blind 204 controlled by the controller 215 is controlled so that the illuminometer 210 is brought to the illumination area 222, and the position of the illumination area 222 is controlled in accordance with the shifting movement of the illuminometer 210.

Explaining in more detail, as shown in FIG. 19, a width of the illumination area 222 in the X-axis direction is defined by the variable blind 204 so that such a width becomes constant and substantially the same as the width of the measurement range 220 of the light intensity distribution. The illumination area 222 is shifted in the Y direction at a constant speed. That is to say, the strip-shaped or band-shaped illumination area 222 is shifted in the Y direction at the predetermined speed. The Y-axis direction width of the illumination area 222 in this case is restricted to a predetermined width so that the measurement of the illuminometer 210 is not affected by the variable blind 204 even in the conditions shown in the sections (a), (c), (d) of FIG. 19.

Now, the operation of the variable blind 204 in this case will be explained with reference to FIG. 20. For example, from the condition shown in the section (a) of FIG. 19 to the condition shown in the section (c) of FIG. 19, although the illuminometer 210 is shifted in+X direction at the speed of Vs, when this is converted to the position corresponding to the plane of the variable blind 204, it is assumed that the illuminometer is shifted at a speed of Vx. The light shield members BYa, BYb of the variable blind 204 are shifted at a constant speed of Vy while keeping a predetermined distance therebetween. After the illuminometer 210 is scanned in+X direction once (condition shown in the section (c) of FIG. 19), the illuminometer 210 is shifted in the Y direction, as shown in sections (c) and (d) of FIG. 19. The illuminometer 210 is shifted to a next scan start position. From the condition shown in the section (d) of FIG. 19, the illuminometer 210 is shifted in−X direction. By repeating these movements, the light intensity distribution within the measurement range 220 is measured.

In the second example, since the area of the illumination area 222 can be smaller than the measurement range, an amount of the illumination light incident on the projection optical system LX can be reduced. Accordingly, a heat amount absorbed by optical members of the projection optical system LX can be reduced.

Since the controller 215 controls only the shifting movements of the light shield members BYa, BYb of the variable blind 204 while maintaining the X-axis positions of the light shield members BXa, BXb constant, the variable blind 204 can easily be controlled. That is to say, since the light shield members BYa, BYb are shifted in the Y-axis direction and the light shield members BXa, BXb are not shifted in the X-axis direction, time periods required for calculation and the setting of the variable blind can be reduced.

Figure 21:
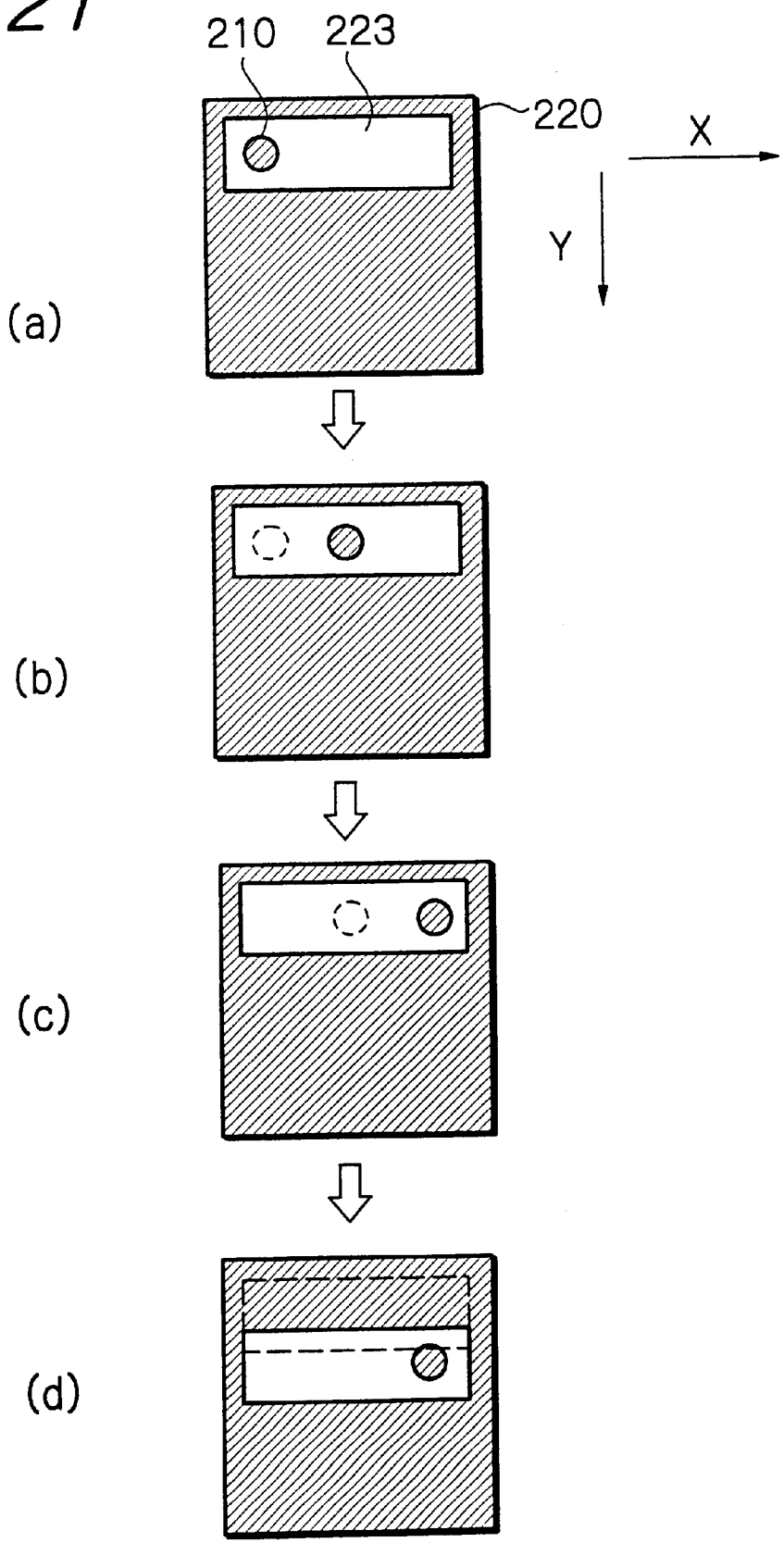
FIG. 21 is a view showing a third example of a method for measuring the light intensity distribution according to the present invention.

FIG. 21 schematically shows a third example of a method for measuring the light intensity distribution. FIG. 21 shows a flow of measurements of the light intensity distribution within the measurement range 220 (on the exposure plane) of the illumination light flux. In the section (a) of FIG. 21, the measurement of the light intensity distribution is started. Sections (b), (c) and (d) of FIG. 21 show conditions that the illuminometer 210 is shifted by the controller 215 within the measurement range 220.

From the condition shown in the section (a) of FIG. 21 to the condition shown in the section (c) of FIG. 21, the illuminometer 210 is shifted in+X direction at a speed of Vs, while measuring the light intensity of the illumination light. Then, from the condition shown in the section (d) of FIG. 21, the illuminometer 210 is shifted in−X direction at the speed of Vs. By repeating these shifting movements, the light intensity distribution within the measurement range 220 is measured.

At the same time, an illumination area 223 defined by the variable blind 204 controlled by the controller 215 is controlled so that the illuminometer 210 is brought to the illumination area 223, and the position of the illumination area 223 is controlled in accordance with the shifting movement of the illuminometer 210.

Figure 22:
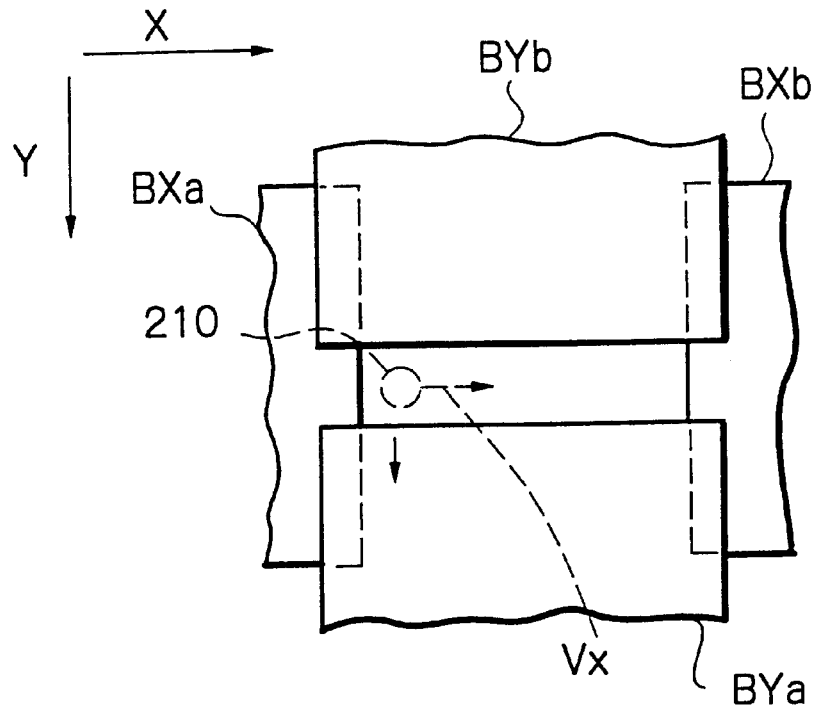
FIG. 22 is a view showing an operation of a blind in the third example.

Now, the operation of the variable blind 204 in this case will be explained with reference to FIG. 22. For example, from the condition shown in the section (a) of FIG. 21 to the condition shown in the section (c) of FIG. 21, although the illuminometer 210 is shifted in+X direction at the speed of Vs, when this is converted to the position corresponding to the plane of the variable blind 204, it is assumed that the illuminometer is shifted at a speed of Vx. The light shield members BYa, BYb of the variable blind 204 are kept stationary while maintaining a predetermined distance therebetween. After the illuminometer 210 was scanned in+X direction once (condition shown in the section (c) of FIG. 21), the illuminometer 210 is shifted in the Y direction, as shown in sections (c) and (d) of FIG. 21. When the illuminometer 210 is shifted in the Y direction, the light shield members BYa, BYb of the variable blind 204 are shifted in the Y direction while keeping the light shield members BXa, BXb stationary. From the condition shown in the section (d) of FIG. 21, the illuminometer 210 is shifted in−X direction. By shifting the illuminometer 210 and the illumination area 223 within the measurement range 220 similarly, the light intensity is measured.

In the third example, since the area of the illumination area 223 can be smaller than the measurement range, an amount of the illumination light incident on the projection optical system LX can be reduced. Accordingly, a heat amount absorbed by optical members of the projection optical system LX can be reduced.

Since the controller 215 controls only the shifting movements of the light shield members BYa, BYb of the variable blind 204 while maintaining the X-axis positions of the light shield members BXa, BXb constant, the variable blind 204 can easily be controlled. That is to say, since the light shield members BYa, BYb may be shifted in the Y-axis direction only when the illuminometer 210 is shifted in the Y direction and the light shield members BXa, BXb are not shifted in the X-axis direction, time periods required for calculation and the setting of the variable blind 204 can be reduced.

Figure 23:
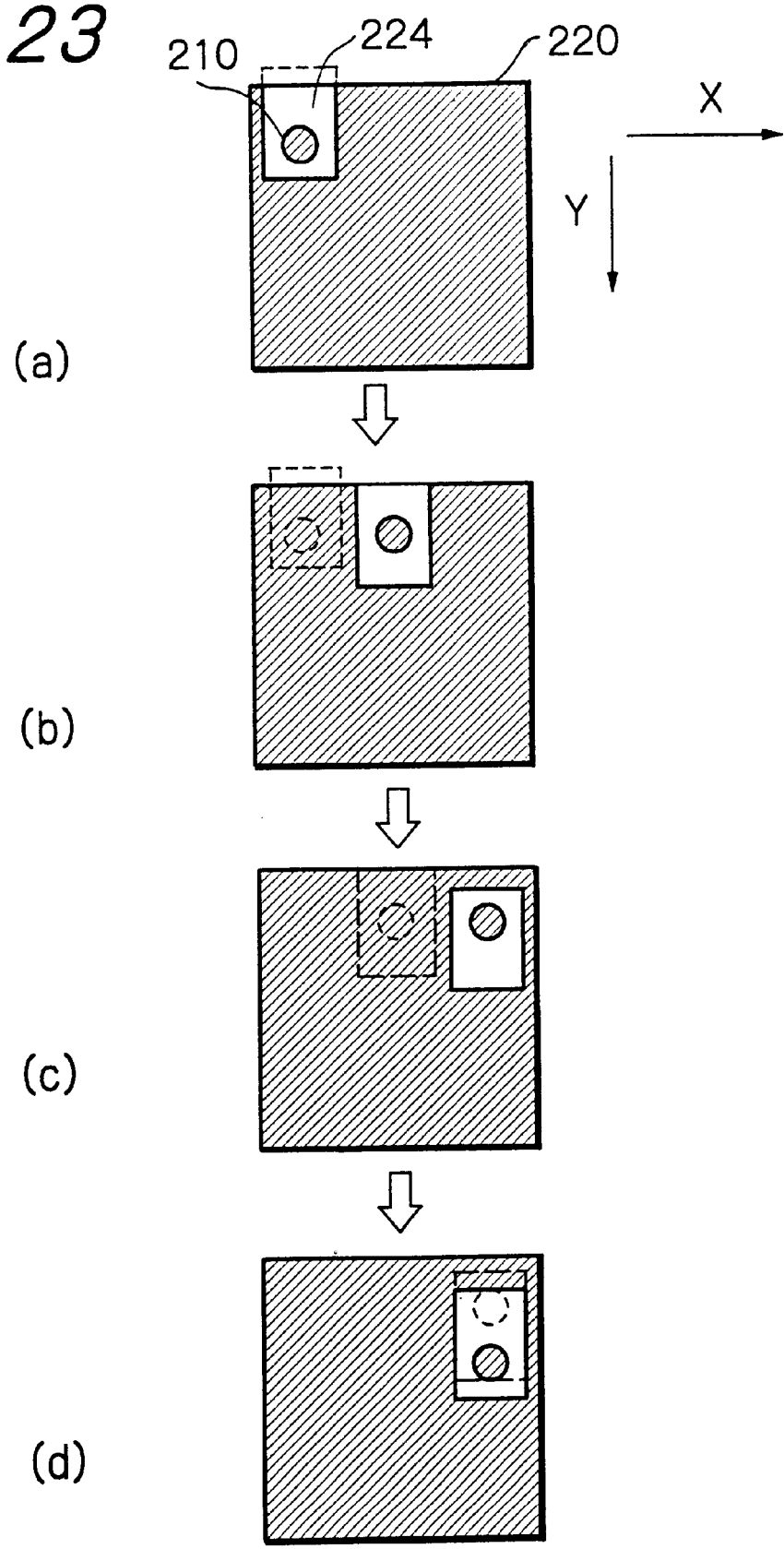
FIG. 23 is a view showing a fourth example of a method for measuring the light intensity distribution according to the present invention.

FIG. 23 schematically shows a third example of a method for measuring the light intensity distribution. FIG. 23 shows a flow of measurements of the light intensity distribution within the measurement range 220 (on the exposure plane) of the illumination light flux. In the section (a) of FIG. 23, the measurement of the light intensity distribution is started. Sections (b), (c) and (d) of FIG. 23 show conditions that the illuminometer 210 is shifted by the controller 215 within the measurement range 220.

From the condition shown in the section (a) of FIG. 23 to the condition shown in the section (c) of FIG. 23, the illuminometer 210 is shifted in+X direction at a speed of Vs, while measuring the light intensity of the illumination light. Then, from the condition shown in the section (d) of FIG. 23, the illuminometer 210 is shifted in−X direction at the speed of Vs. By repeating these shifting movements, the light intensity distribution within the measurement range 220 is measured.

At the same time, an illumination area 224 defined by the variable blind 204 controlled by the controller 215 is controlled so that the illuminometer 210 is brought to the illumination area 224, and the position of the illumination area 224 is controlled in accordance with the shifting movement of the illuminometer 210.

Explaining in more detail, as shown in FIG. 23, the illumination area 224 is shifted in the Y direction at a constant speed and is also shifted in the X direction in correspondence to the shifting speed Vs of the illuminometer. That is to say, the light intensity distribution is measured while shifting the illumination area 224 within the measurement range 22 in a zig-zag fashion. An X-axis direction width and a Y-axis direction width of the illumination area 224 in this case are restricted to predetermined widths so that the measurement of the illuminometer 210 is not affected by the variable blind 204 even in the conditions shown in the sections (a), (c), (d) of FIG. 23.

Figure 24:
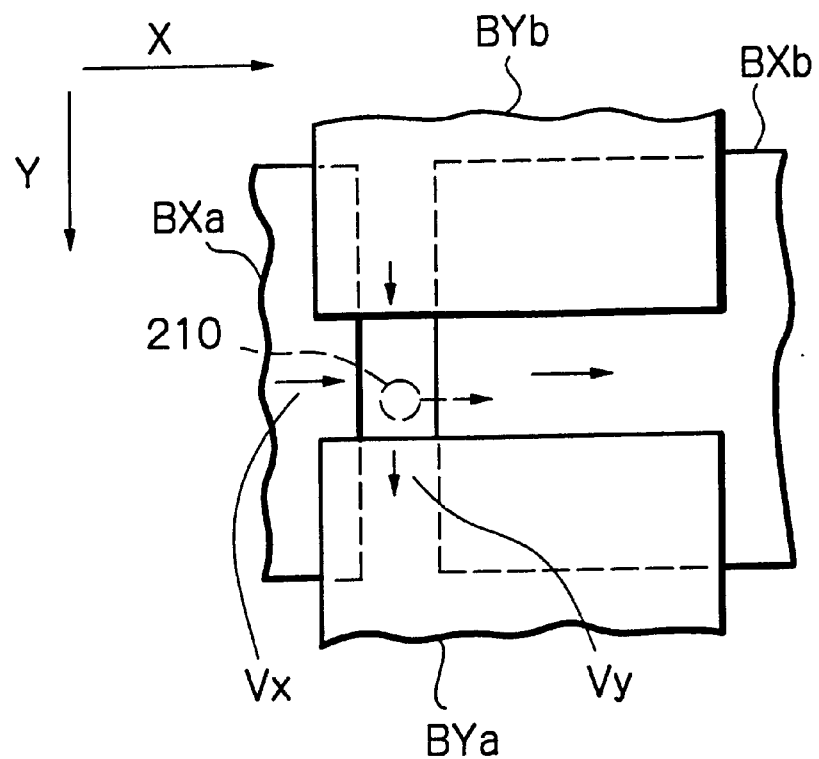
FIG. 24 is a view showing an operation of a blind in the fourth example.

Now, the operation of the variable blind 204 in this case will be explained with reference to FIG. 24. For example, from the condition shown in the section (a) of FIG. 23 to the condition shown in the section (c) of FIG. 23, although the illuminometer 210 is shifted in+X direction at the speed of Vs, when this is converted to the position corresponding to the plane of the variable blind 204, it is assumed that the illuminometer is shifted at a speed of Vx. In synchronous with the shifting movement of the illuminometer 210, the light shield members BXa, BXb of the variable blind 204 are shifted in+X direction at a speed of Vx. The light shield members BYa, BYb of the variable blind 204 are shifted at a constant speed of Vy while keeping a predetermined distance therebetween. After the illuminometer 210 is scanned in+X direction once (condition shown in the section (c) of FIG. 23), the illuminometer 210 is shifted in the Y direction, as shown in the sections (c) and (d) of FIG. 23. By such shifting movements, the illuminometer 210 is shifted to a next scan start position. From the condition shown in the section (d) of FIG. 23, the illuminometer 210 is shifted in−X direction. By repeating these shifting movements, the light intensity distribution within the measurement range 220 is measured.

In the fourth example, since the area of the illumination area 224 can be smaller than the measurement range, an amount of the illumination light incident on the projection optical system LX can be reduced. Accordingly, a heat amount absorbed by optical members of the projection optical system LX can be reduced.

Since the controller 215 can effect the shifting movements of the light shield members BXa, BXb of the variable blind 204 in the X-axis direction and the shifting movements of the light shield members BYa, BYb in the Y-axis direction to shift the illumination area continuously, a time period required for the setting of the illumination area can be reduced. Further, since the illumination area which is always illuminated is changed, it is possible to suppress a local heat increase in the projection optical system LX.

As mentioned above, according to the second embodiment of the present invention, when the light intensity distribution within the measurement range is measured, the illumination area being measured can be reduced by the variable blind 204 in comparison with the measurement range of the light intensity distribution. That is to say, since the illumination light incident on the projection optical system is limited, the amount of the illumination light passed through the projection optical system can be reduced, and, thus, the amount of the illumination light passed through the optical members can be reduced. As a result, the deterioration of the imaging feature due to the temperature increase of the projection optical system can be suppressed, the time period required for cooling the projection lens after the measurement of the light intensity can be reduced, and the time period required from start to finish of the measurement of the light intensity distribution can be reduced, thereby improving the operability.

The foregoing first and second embodiments are described in connection with a reduction projection exposure apparatus of a step and repeat type (stepper). However, the invention can also be applied to projection-scan reduction exposure apparatuses of a step and scan type (scanning stepper) such as shown in U.S. Pat. No. 5,194,893, U.S. Pat. No. 5,473,410, U.S. Pat. No. 5,591,958 and U.S. Pat. No. 5,534,970 or a mirror projection aligner.

As to the illumination light for exposure used in a projection exposure apparatus according to the invention, an $F_2$ laser beam (wavelength 157 nm) and a high harmonic wave of YAG laser may be used, in addition to bright-lines emitted from a mercury lamp (such as g-line and i-line), KrF excimer laser (wavelength 248 nm) and ArF excimer laser (wavelength 193 nm).

In a projection exposure apparatus using $F_2$ laser, all or major portion of a plurality of optical elements composing an illumination optical system and a projection optical system, as well as a reticle are formed by fluorite. Also in a projection exposure apparatus using ArF excimer laser, a portion of optical elements are formed by fluorite. Since linear thermal expansion coefficient of fluorite is greater than that of quartz, the invention is especially beneficial when applied to a projection exposure apparatus using optical elements made of fluorite. In a projection optical apparatus using $F_2$ laser, it occurs that a reticle of reflex type is used in place of a reticle of fluorite.

It is possible to use, in place of a projection optical system comprising only a plurality of refractive optical elements, a reflective-refractive optical system comprising, for example, reflective optical elements including a concave mirror having a reflective surface processed to have an aspheric surface and refractive optical elements.

The invention is also applicable to a projection exposure apparatus using, as illumination light, EUV (Extreme Ultra Violet) light having an oscillation spectrum in soft X-ray zone (for example 5–15 nm). In a projection exposure apparatus using EUV light, an illumination area on a reflective mask is defined as an arcuate slit and a reduction projection optical system has a plurality of reflective optical elements only. The reflective mask and a wafer are moved in synchronism in a velocity ratio depending on the magnification of the reduction projection optical system to transfer a pattern on the mask to the wafer.

Furthermore, in a projection exposure apparatus using $F_2$ laser or EUV light as illumination light and a reflective mask, the illumination light for exposure is directed to a pattern surface of the reflective mask so that the optical axis thereof is angularly displaced from an axis normal to the pattern surface of the mask. Due to this face, a projection exposure apparatus of this type employs a projection optical system which is non-elecentric on the object side (mask side). Thus, the magnification of the projection optical system PL in this projection exposure apparatus may be adjusted by shifting the reflective mask along the optical axis of the projection optical system.

Furthermore, in the first and second embodiments, the blind 20 or 204 for regulating the illumination area of the illumination light on the reticle are positioned substantially in a plane in conjugation with the pattern surface of the reticle. However, the blind may, for example, be positioned in the vicinity of the reticle. In this case, the blind may be positioned in either of the projection optical system side and the illumination optical system side. Furthermore, a plurality of movable blades (light shielding members) constituting the blind 20 (or 204) may be disposed in different planes in the illumination light path between the light source and the projection optical system.

Furthermore, in a projection exposure apparatus having a projection optical system which forms an intermediate image of the reticle pattern, in other words, forms an image of the reticle pattern in a predetermined plane between the object plane and the image plane and then re-form the image on a wafer, the blind 20 or 204 may be positioned in this predetermined plane or in the vicinity thereof. Alternatively, a portion of a plurality of movable blades of the blind may be placed in this predetermined plane or in the vicinity thereof.

Although it is desired that the area except for the illumination area defined by the blind 20 or 204 is completely shield from the illumination light, the arrangement may be such that the light distributed to the area except for the illumination area is only attenuated.

What is claimed is:

1. A method of measuring an optical feature of an exposure apparatus comprising a projection optical system which projects a pattern formed on a mask onto a substrate, said method comprising:

setting an illumination area so as to simultaneously illuminate a plurality of measuring positions within an image field of said projection optical system;

blocking an illumination light reaching an area which encompasses a first measuring position and a second measuring position which differs from said first measuring position and including a third measuring position differs from said first and said second measuring positions, the first, second and third measuring positions being different from each other, and the measuring positions being arranged in the image field of the projection optical system respectively;

detecting the illumination light passed through said projection optical system and reached at said image filed; and changing the area which said illumination light is blocked to reach in said image field when the measuring positions in said image field are changed.

2. A method according to claim 1, wherein said optical feature includes intensity distribution of the illumination light on a projection area of said projection optical system.

3. A method according to claim 2, wherein said detecting the illumination light includes successively moving a light receiving portion which receives and detects the illumination light, from one measuring position to the next measuring position of said plurality of measuring positions within said image field.

4. A method according to claim 1, further comprising projecting a pattern formed on a mask to said image field and detecting an image of said pattern projected, wherein said measuring the optical feature is carried out according to a detected result of said image of said pattern projected within said image field.

5. A method according to claim 4, wherein said optical feature includes an imaging feature of said projection optical system.

6. A method according to claim 5, wherein said imaging feature includes at least one of magnification, distortion, coma, spherical surface, focus, astigmatism, and field curvature.

7. A method according to claim 5, further comprising correcting said imaging feature of said projection optical system based on its measured result.

8. A method according to claim 7, wherein said correcting said imaging feature of said projection optical system includes changing an internal pressure of a closed chamber disposed within said projection optical system.

9. A method according to claim 7, wherein said correcting said imaging feature of said projection optical system includes at least either one of moving at least one lens element of said projection optical system in a direction of an optical axis of said projection optical system and tilting at least one lens element of said projection optical system against a plane perpendicular to said optical axis.

10. A method according to claim 1, wherein said second measuring position is a position which is measured following a measurement at said first measuring position.

11. A method according to claim 10, wherein said blocking the illumination light includes blocking the illumination light reaching said first measuring position after the measurement at said first measuring position has been completed.

12. A method according to claim 11, wherein said third measuring position is a position which is measured following the measurement at said second measuring position, and said blocking the illumination light includes blocking the illumination light reaching an area excluding a limited area which surrounds said second measuring position and said third measuring position after the measurement at said first measuring position has been completed.

13. A method according to claim 1 wherein a plurality of said measuring positions in the image field are illuminated simultaneously even after the change of the area which said illumination light is blocked to reach.

14. A method according to claim 11, wherein said blocking the illumination light is effected by a movable blind disposed between a light source generating said illumination light and said projection optical system.

15. A projection exposure apparatus comprising:
a light source that generates an illumination light;
a projection optical system which projects a pattern formed on a mask onto a substrate using said illumination light;
a detector that detects the illumination light reached at a plurality of measuring positions within an image field of the projection optical system;
a blocking member, that is electrically connected to the light source and the detector, and that blocks the illumination light reaching at an area of said image field including a third measurement position and excluding an area including at least a first measuring position and a second measuring position, the first, second and third measuring positions being different from each other, and the measuring positions being arranged in the image field of the projection optical system respectively, and
a control system that is electrically connected to said blocking member and that controls said blocking member such that the area which said illumination light is blocked to reach is changed in said image field when the measuring positions in said image field are changed.

16. A projection exposure apparatus according to claim 15, further comprising:
a measurement device, which is electrically connected to said detector, and which measures an optical feature of said projection exposure apparatus according to the illumination light which has been reached within said image field and which has been detected by said detector.

17. A projection exposure apparatus according to claim 16, wherein said optical feature includes a light intensity distribution on a projection area of said projection optical system on which the illumination light is projected.

18. A projection exposure apparatus according to claim 16, wherein said projection optical system projects an image of a pattern formed on a mask to said image field, and said measurement device measures an imaging feature of said projection optical system according to a detected result of an image of said pattern projected to said image field which is detected by said detector.

19. A projection exposure apparatus according to claim 18, wherein said imaging feature includes at least one of magnification, distortion, coma, spherical surface, focus, astigmatism, and field curvature.

20. A projection exposure apparatus according to claim 18, further comprising:
a correction device, which is electrically connected to said measurement device, and which corrects said imaging feature of said projection optical system according to measured results.

21. A projection exposure apparatus according to claim 20, wherein said correction device includes at least one of a changing device which changes an internal pressure of a closed chamber of said projection optical system, a lens moving device which moves at least one lens element of said projection optical system in a direction of an optical axis of said projection optical system and a lens tilting device which tilts at least one lens element of said projection optical system against a plane perpendicular to said optical axis.

22. A projection exposure apparatus according to claim 15, wherein said detector is successively moved from one measuring position to another measuring position of said plurality of measuring positions of said image field.

23. A projection exposure apparatus according to claim 15, wherein said second measuring position includes a position adapted to measure following the measurement of said first measuring position.

24. A projection exposure apparatus according to claim 15, wherein said blocking member includes a movable blind disposed between said light source and said projection optical system.

25. A method according to claim 15 wherein said control system controls the change of the area which said illumination light is blocked to reach by the blocking member such that a plurality of said measuring positions in the image field are illuminated simultaneously even after the change of the area which said illumination light is blocked to reach.

26. A method of manufacturing a projection exposure apparatus comprising:
providing a projection optical system which projects a pattern formed on a mask onto a substrate;
providing a light source which generates an illumination light at the opposite side of an image side of said projection optical system;
providing a detector detectable the illumination light at a plurality of measuring positions within an image field of said projection optical system at the image side of said projection optical system;
providing a blocking member between said light source and said detector which blocks the illumination light reaching an area within said image field excluding a limited area including at least a first measuring position and a second measuring position and including a third measuring position, the first, second and third measuring positions being different from each other, and the measuring positions being arranged in the image field of the projection optical system respectively, and
providing a control system that is electrically connected to said blocking member and that controls said blocking member such that the area which said illumination light is blocked to reach is changed in said image field when the measuring positions in said image field are changed.

27. A method according to claim 26 wherein said control system controls the change of the area which said illumination light is blocked to reach by the blocking member such that a plurality of said measuring positions in the image file dare illuminated simultaneously even after the change of the area which said illumination light is blocked to reach.

* * * * *